(12) United States Patent
Haba

(10) Patent No.: US 12,046,569 B2
(45) Date of Patent: Jul. 23, 2024

(54) INTEGRATED DEVICE PACKAGES WITH INTEGRATED DEVICE DIE AND DUMMY ELEMENT

(71) Applicant: ADEIA SEMICONDUCTOR BONDING TECHNOLOGIES INC., San Jose, CA (US)

(72) Inventor: Belgacem Haba, Saratoga, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 18/295,776

(22) Filed: Apr. 4, 2023

(65) Prior Publication Data

US 2023/0420398 A1 Dec. 28, 2023

Related U.S. Application Data

(63) Continuation of application No. 16/917,686, filed on Jun. 30, 2020, now Pat. No. 11,631,647.

(51) Int. Cl.
| | |
|---|---|
| *H01L 23/00* | (2006.01) |
| *H01L 21/56* | (2006.01) |
| *H01L 21/78* | (2006.01) |

(52) U.S. Cl.
CPC .......... *H01L 24/08* (2013.01); *H01L 21/561* (2013.01); *H01L 21/565* (2013.01);
(Continued)

(58) Field of Classification Search
CPC ..... H01L 24/08; H01L 21/561; H01L 21/565; H01L 21/568; H01L 21/78; H01L 24/80;
(Continued)

(56) References Cited

U.S. PATENT DOCUMENTS

| | | | |
|---|---|---|---|
| 4,998,665 | A | 3/1991 | Hayashi |
| 5,019,673 | A | 5/1991 | Juskey et al. |

(Continued)

FOREIGN PATENT DOCUMENTS

| | | |
|---|---|---|
| CN | 103681646 | 3/2014 |
| CN | 107527885 | 12/2017 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.

(Continued)

*Primary Examiner* — Didarul A Mazumder
(74) *Attorney, Agent, or Firm* — Knobbe, Martens, Olson & Bear, LLP

(57) ABSTRACT

In one embodiment, an integrated device package is disclosed. The integrated device package can comprise a carrier an a molding compound over a portion of an upper surface of the carrier. The integrated device package can comprise an integrated device die mounted to the carrier and at least partially embedded in the molding compound, the integrated device die comprising active circuitry. The integrated device package can comprise a stress compensation element mounted to the carrier and at least partially embedded in the molding compound, the stress compensation element spaced apart from the integrated device die, the stress compensation element comprising a dummy stress compensation element devoid of active circuitry. At least one of the stress compensation element and the integrated device die can be directly bonded to the carrier without an adhesive.

34 Claims, 21 Drawing Sheets

(52) U.S. Cl.
CPC ............ *H01L 21/568* (2013.01); *H01L 21/78* (2013.01); *H01L 24/80* (2013.01); *H01L 2224/08145* (2013.01); *H01L 2224/80006* (2013.01); *H01L 2224/80895* (2013.01); *H01L 2224/80896* (2013.01)

(58) Field of Classification Search
CPC . H01L 2224/08145; H01L 2224/80006; H01L 2224/80895; H01L 2224/80896
USPC ........................................................ 257/777
See application file for complete search history.

(56) References Cited

U.S. PATENT DOCUMENTS

| | | |
|---|---|---|
| 5,051,802 A | 9/1991 | Prost et al. |
| 5,087,585 A | 2/1992 | Hayashi |
| 5,322,593 A | 6/1994 | Hasegawa et al. |
| 5,729,896 A | 3/1998 | Dalal et al. |
| 5,753,536 A | 5/1998 | Sugiyama et al. |
| 5,771,555 A | 6/1998 | Eda et al. |
| 5,854,507 A | 12/1998 | Miremadi et al. |
| 5,956,605 A | 9/1999 | Akram et al. |
| 5,985,739 A | 11/1999 | Plettner et al. |
| 5,998,808 A | 12/1999 | Matsushita |
| 6,008,126 A | 12/1999 | Leedy |
| 6,049,124 A | 4/2000 | Raiser et al. |
| 6,080,640 A | 6/2000 | Gardner et al. |
| 6,121,688 A | 9/2000 | Akagawa |
| 6,265,775 B1 | 7/2001 | Seyyedy |
| 6,374,770 B1 | 4/2002 | Lee |
| 6,410,983 B1 | 6/2002 | Moriizumi et al. |
| 6,423,640 B1 | 7/2002 | Lee et al. |
| 6,465,892 B1 | 10/2002 | Suga |
| 6,500,694 B1 | 12/2002 | Enquist |
| 6,582,991 B1 | 6/2003 | Maeda et al. |
| 6,686,588 B1 | 2/2004 | Webster et al. |
| 6,713,857 B1 | 3/2004 | Tsai |
| 6,768,208 B2 | 7/2004 | Lin et al. |
| 6,782,610 B1 | 8/2004 | Iijima et al. |
| 6,867,073 B1 | 3/2005 | Enquist |
| 6,887,769 B2 | 5/2005 | Kellar et al. |
| 6,908,027 B2 | 6/2005 | Tolchinsky et al. |
| 6,962,835 B2 | 11/2005 | Tong et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,262,492 B2 | 8/2007 | Pieda et al. |
| 7,319,197 B2 | 1/2008 | Oggioni et al. |
| 7,354,798 B2 | 4/2008 | Pogge et al. |
| 7,385,283 B2 | 6/2008 | Wu et al. |
| 7,554,203 B2 | 6/2009 | Zhou et al. |
| 7,566,634 B2 | 7/2009 | Beyne et al. |
| 7,582,971 B2 | 9/2009 | Kameyama et al. |
| 7,589,409 B2 | 9/2009 | Gibson et al. |
| 7,663,231 B2 | 2/2010 | Chang et al. |
| 7,750,488 B2 | 7/2010 | Patti et al. |
| 7,759,751 B2 | 7/2010 | Ono |
| 7,781,309 B2 | 8/2010 | Morita et al. |
| 7,786,572 B2 | 8/2010 | Chen |
| 7,790,578 B2 | 9/2010 | Furui |
| 7,803,693 B2 | 9/2010 | Trezza |
| 7,816,235 B2 | 10/2010 | Chan et al. |
| 7,816,856 B2 | 10/2010 | Cok et al. |
| 7,843,052 B1 | 11/2010 | Yoo et al. |
| 7,897,481 B2 | 3/2011 | Chiou et al. |
| 7,932,616 B2 | 4/2011 | Meguro |
| 7,977,789 B2 | 7/2011 | Park |
| 8,026,181 B2 | 9/2011 | Arita et al. |
| 8,049,303 B2 | 11/2011 | Osaka et al. |
| 8,064,224 B2 | 11/2011 | Mahajan et al. |
| 8,168,458 B2 | 5/2012 | Do et al. |
| 8,178,963 B2 | 5/2012 | Yang |
| 8,178,964 B2 | 5/2012 | Yang |
| 8,183,127 B2 | 5/2012 | Patti et al. |
| 8,193,632 B2 | 6/2012 | Chang et al. |
| 8,227,904 B2 | 7/2012 | Braunisch et al. |
| 8,241,961 B2 | 8/2012 | Kim et al. |
| 8,263,434 B2 | 9/2012 | Pagaila et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,405,225 B2 | 3/2013 | Yu et al. |
| 8,441,131 B2 | 5/2013 | Ryan |
| 8,456,856 B2 | 6/2013 | Lin et al. |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,513,088 B2 | 8/2013 | Yoshimura et al. |
| 8,519,514 B2 | 8/2013 | Fujii |
| 8,524,533 B2 | 9/2013 | Tong et al. |
| 8,620,164 B2 | 12/2013 | Heck et al. |
| 8,647,987 B2 | 2/2014 | Yang et al. |
| 8,691,601 B2 | 4/2014 | Izuha |
| 8,697,493 B2 | 4/2014 | Sadaka |
| 8,716,105 B2 | 5/2014 | Sadaka et al. |
| 8,791,575 B2 | 7/2014 | Oganesian et al. |
| 8,802,538 B1 | 8/2014 | Liu |
| 8,809,123 B2 | 8/2014 | Liu et al. |
| 8,841,002 B2 | 9/2014 | Tong |
| 8,878,353 B2 | 11/2014 | Haba et al. |
| 8,901,748 B2 | 12/2014 | Manusharow et al. |
| 8,912,670 B2 | 12/2014 | Teh et al. |
| 8,975,163 B1 | 3/2015 | Lei et al. |
| 8,975,726 B2 | 3/2015 | Chen et al. |
| 8,987,137 B2 | 3/2015 | Bachman et al. |
| 8,988,299 B2 | 3/2015 | Kam et al. |
| 9,006,908 B2 | 4/2015 | Pincu et al. |
| 9,029,242 B2 | 5/2015 | Holden et al. |
| 9,054,101 B2 | 6/2015 | Semmelmeyer et al. |
| 9,059,010 B2 | 6/2015 | Yoshida et al. |
| 9,076,860 B1 | 7/2015 | Lei et al. |
| 9,076,929 B2 | 7/2015 | Katsuno et al. |
| 9,093,350 B2 | 7/2015 | Endo et al. |
| 9,126,236 B2 | 9/2015 | Roos et al. |
| 9,136,293 B2 | 9/2015 | Yee et al. |
| 9,142,517 B2 | 9/2015 | Liu et al. |
| 9,153,552 B2 | 10/2015 | Teh et al. |
| 9,159,690 B2 | 10/2015 | Chiu |
| 9,171,756 B2 | 10/2015 | Enquist et al. |
| 9,171,816 B2 | 10/2015 | Teh et al. |
| 9,184,125 B2 | 11/2015 | Enquist et al. |
| 9,190,380 B2 | 11/2015 | Teh et al. |
| 9,224,697 B1 | 12/2015 | Kwon et al. |
| 9,224,704 B2 | 12/2015 | Landru |
| 9,230,941 B2 | 1/2016 | Chen et al. |
| 9,252,172 B2 | 2/2016 | Chow et al. |
| 9,257,399 B2 | 2/2016 | Kuang et al. |
| 9,269,701 B2 | 2/2016 | Starkston et al. |
| 9,275,971 B2 | 3/2016 | Chiu et al. |
| 9,299,736 B2 | 3/2016 | Chen et al. |
| 9,312,198 B2 | 4/2016 | Meyer et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,433 B2 | 5/2016 | Lee et al. |
| 9,349,703 B2 | 5/2016 | Chiu et al. |
| 9,355,997 B2 | 5/2016 | Katkar et al. |
| 9,368,866 B2 | 6/2016 | Yu |
| 9,373,527 B2 | 6/2016 | Yu et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,443,824 B1 | 9/2016 | We et al. |
| 9,461,007 B2 | 10/2016 | Chun et al. |
| 9,466,586 B1 | 10/2016 | Choi et al. |
| 9,476,898 B2 | 10/2016 | Takano |
| 9,496,239 B1 | 11/2016 | Edelstein et al. |
| 9,524,959 B1 * | 12/2016 | Yeh .................... H01L 23/5226 |

(56) References Cited

U.S. PATENT DOCUMENTS

| | | |
|---|---|---|
| 9,536,848 B2 | 1/2017 | England et al. |
| 9,559,081 B1 | 1/2017 | Lai et al. |
| 9,570,421 B2 | 2/2017 | Wu et al. |
| 9,601,353 B2 | 3/2017 | Huang et al. |
| 9,620,481 B2 | 4/2017 | Edelstein et al. |
| 9,627,365 B1 | 4/2017 | Yu et al. |
| 9,653,433 B2 | 5/2017 | Yu et al. |
| 9,656,852 B2 | 5/2017 | Cheng et al. |
| 9,666,502 B2 | 5/2017 | Chen et al. |
| 9,666,559 B2 | 5/2017 | Wang et al. |
| 9,673,096 B2 | 6/2017 | Hirschler et al. |
| 9,674,939 B2 | 6/2017 | Scannell |
| 9,704,827 B2 | 7/2017 | Huang et al. |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,133 B1 | 9/2017 | Wu et al. |
| 9,799,587 B2 | 10/2017 | Fujii et al. |
| 9,818,729 B1 | 11/2017 | Chiu et al. |
| 9,852,988 B2 | 12/2017 | Enquist et al. |
| 9,865,567 B1 | 1/2018 | Chaware et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,180 B2 | 4/2018 | Kim et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,966,360 B2 | 5/2018 | Yu et al. |
| 10,008,844 B2 | 6/2018 | Wang et al. |
| 10,026,605 B2 | 7/2018 | Doub et al. |
| 10,032,722 B2 | 7/2018 | Yu et al. |
| 10,074,630 B2 | 9/2018 | Kelly et al. |
| 10,075,657 B2 | 9/2018 | Fahim et al. |
| 10,170,409 B2 | 1/2019 | Ganesan et al. |
| 10,204,893 B2 | 2/2019 | Uzoh et al. |
| 10,269,619 B2 | 4/2019 | Yu et al. |
| 10,269,756 B2 | 4/2019 | Uzoh |
| 10,269,853 B2 | 4/2019 | Katkar et al. |
| 10,276,619 B2 | 4/2019 | Kao et al. |
| 10,276,909 B2 | 4/2019 | Huang et al. |
| 10,333,623 B1 | 6/2019 | Liao et al. |
| 10,410,976 B2 | 9/2019 | Asano et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,504,824 B1 | 12/2019 | Pan et al. |
| 10,508,030 B2 | 12/2019 | Katkar et al. |
| 10,510,629 B2 | 12/2019 | Chen et al. |
| 10,522,499 B2 | 12/2019 | Enquist et al. |
| 10,529,690 B2 * | 1/2020 | Shih .................... H01L 24/81 |
| 10,559,507 B1 | 2/2020 | Saketi et al. |
| 10,580,823 B2 | 3/2020 | Zhang et al. |
| 10,629,567 B2 | 4/2020 | Uzoh et al. |
| 10,707,087 B2 | 7/2020 | Uzoh et al. |
| 10,707,145 B2 | 7/2020 | Bultitude et al. |
| 10,727,204 B2 | 7/2020 | Agarwal et al. |
| 10,727,219 B2 | 7/2020 | Uzoh et al. |
| 10,770,430 B1 | 9/2020 | Kim et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,872,852 B2 | 12/2020 | Shih |
| 10,879,212 B2 | 12/2020 | Uzoh et al. |
| 10,879,226 B2 | 12/2020 | Uzoh et al. |
| 10,886,177 B2 | 1/2021 | DeLaCruz et al. |
| 10,892,246 B2 | 1/2021 | Uzoh |
| 10,910,344 B2 | 2/2021 | DeLaCruz et al. |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,145,623 B2 | 10/2021 | Hsu et al. |
| 11,145,626 B2 | 10/2021 | Hwang et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,222,863 B2 | 1/2022 | Hua et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,427 B2 | 6/2022 | Loo et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,437,423 B2 | 9/2022 | Takachi |
| 11,462,419 B2 | 10/2022 | Haba |
| 11,476,213 B2 | 10/2022 | Haba et al. |
| 11,538,781 B2 | 12/2022 | Haba |
| 11,558,029 B2 | 1/2023 | Ito |
| 11,631,647 B2 | 4/2023 | Haba |
| 11,652,083 B2 | 5/2023 | Uzoh et al. |
| 11,658,173 B2 | 5/2023 | Uzoh et al. |
| 11,728,273 B2 | 8/2023 | Haba |
| 11,764,177 B2 | 9/2023 | Haba |
| 11,764,189 B2 | 9/2023 | Gao et al. |
| 11,817,409 B2 | 11/2023 | Haba et al. |
| 11,837,582 B2 | 12/2023 | Gao et al. |
| 11,837,596 B2 | 12/2023 | Uzoh et al. |
| 11,916,076 B2 | 2/2024 | DeLaCruz et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2003/0148591 A1 | 8/2003 | Guo et al. |
| 2004/0084414 A1 | 5/2004 | Sakai et al. |
| 2004/0140546 A1 | 7/2004 | Lee et al. |
| 2004/0157407 A1 | 8/2004 | Tong et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0101130 A1 | 5/2005 | Lopatin et al. |
| 2005/0104196 A1 | 5/2005 | Kashiwazaki |
| 2005/0133930 A1 | 6/2005 | Savastisuk et al. |
| 2005/0153522 A1 | 7/2005 | Hwang et al. |
| 2005/0161808 A1 | 7/2005 | Anderson |
| 2005/0218518 A1 | 10/2005 | Jiang et al. |
| 2006/0057945 A1 | 3/2006 | Hsu et al. |
| 2006/0063312 A1 | 3/2006 | Kurita |
| 2006/0087042 A1 | 4/2006 | Kameyama et al. |

(56) References Cited

U.S. PATENT DOCUMENTS

| | | |
|---|---|---|
| 2006/0220256 A1 | 10/2006 | Shim et al. |
| 2006/0223216 A1 | 10/2006 | Chang et al. |
| 2006/0234473 A1 | 10/2006 | Wong et al. |
| 2006/0278331 A1 | 12/2006 | Dugas et al. |
| 2007/0007639 A1 | 1/2007 | Fukazawa et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0122635 A1 | 5/2007 | Lu et al. |
| 2007/0123061 A1 | 5/2007 | Evertsen et al. |
| 2007/0148912 A1 | 6/2007 | Morita et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0036082 A1 | 2/2008 | Eun |
| 2008/0079105 A1 | 4/2008 | Chang et al. |
| 2008/0165521 A1 | 7/2008 | Bernstein et al. |
| 2008/0227238 A1 | 9/2008 | Ko et al. |
| 2008/0231311 A1 | 9/2008 | Condorelli et al. |
| 2008/0265421 A1 | 10/2008 | Brunnbauer et al. |
| 2008/0268614 A1 | 10/2008 | Yang et al. |
| 2008/0272477 A1 | 11/2008 | Do et al. |
| 2008/0308928 A1 | 12/2008 | Chang |
| 2008/0315372 A1 | 12/2008 | Kuan et al. |
| 2009/0029274 A1 | 1/2009 | Olson et al. |
| 2009/0068831 A1 | 3/2009 | Enquist et al. |
| 2009/0095399 A1 | 4/2009 | Zussy et al. |
| 2009/0149023 A1 | 6/2009 | Koyanagi |
| 2009/0206461 A1 | 8/2009 | Yoon |
| 2009/0227089 A1 | 9/2009 | Plaut et al. |
| 2009/0252939 A1 | 10/2009 | Park et al. |
| 2009/0273094 A1 | 11/2009 | Ha et al. |
| 2009/0283898 A1 | 11/2009 | Janzen et al. |
| 2009/0321939 A1 | 12/2009 | Chandrasekaran |
| 2010/0081236 A1 | 4/2010 | Yang et al. |
| 2010/0112782 A1 | 5/2010 | Teixeira |
| 2010/0123268 A1 | 5/2010 | Menard |
| 2010/0129999 A1 | 5/2010 | Zingher et al. |
| 2010/0164083 A1 | 7/2010 | Yim |
| 2010/0167534 A1 | 7/2010 | Iwata |
| 2010/0213819 A1 | 8/2010 | Cok et al. |
| 2010/0258952 A1 | 10/2010 | Fjelstad |
| 2010/0259166 A1 | 10/2010 | Cok et al. |
| 2010/0315110 A1 | 12/2010 | Fenner et al. |
| 2010/0327424 A1 | 12/2010 | Braunisch et al. |
| 2011/0042814 A1 | 2/2011 | Okuyama |
| 2011/0049696 A1 | 3/2011 | Haba et al. |
| 2011/0074033 A1 | 3/2011 | Kaltalioglu et al. |
| 2011/0186977 A1 | 8/2011 | Chi et al. |
| 2011/0248397 A1 | 10/2011 | Coffy et al. |
| 2011/0278717 A1 | 11/2011 | Pagaila et al. |
| 2011/0278732 A1 | 11/2011 | Yu et al. |
| 2011/0290552 A1 | 12/2011 | Palmateer et al. |
| 2012/0003792 A1 | 1/2012 | Cheah et al. |
| 2012/0025396 A1 | 2/2012 | Liao et al. |
| 2012/0049344 A1 | 3/2012 | Pagaila et al. |
| 2012/0056314 A1 | 3/2012 | Pagaila et al. |
| 2012/0074585 A1 | 3/2012 | Koo et al. |
| 2012/0077314 A1 | 3/2012 | Park et al. |
| 2012/0119360 A1 | 5/2012 | Kim et al. |
| 2012/0187516 A1 | 7/2012 | Sato |
| 2012/0190187 A1 | 7/2012 | Yang et al. |
| 2012/0194719 A1 | 8/2012 | Churchwell et al. |
| 2012/0199960 A1 | 8/2012 | Cosue et al. |
| 2012/0212384 A1 | 8/2012 | Kam et al. |
| 2012/0217644 A1 | 8/2012 | Pagaila |
| 2012/0238070 A1 | 9/2012 | Libbert et al. |
| 2013/0001798 A1 | 1/2013 | Choi |
| 2013/0009325 A1 | 1/2013 | Mori |
| 2013/0037936 A1 | 2/2013 | Choi et al. |
| 2013/0037962 A1 | 2/2013 | Xue |
| 2013/0069239 A1 | 3/2013 | Kim et al. |
| 2013/0075923 A1 | 3/2013 | Park et al. |
| 2013/0082399 A1 | 4/2013 | Kim et al. |
| 2013/0122655 A1 | 5/2013 | Yu et al. |
| 2013/0169355 A1 | 7/2013 | Chen et al. |
| 2013/0187292 A1 | 7/2013 | Semmelmeyer et al. |
| 2013/0234320 A1 | 9/2013 | Lu et al. |
| 2013/0264684 A1 | 10/2013 | Yu et al. |
| 2013/0265733 A1 | 10/2013 | Herbsommer et al. |
| 2013/0277855 A1 | 10/2013 | Kang et al. |
| 2013/0299997 A1 | 11/2013 | Sadaka |
| 2013/0334697 A1 | 12/2013 | Shin et al. |
| 2014/0008789 A1 | 1/2014 | Cho |
| 2014/0013606 A1 | 1/2014 | Nah et al. |
| 2014/0071652 A1 | 3/2014 | McShane et al. |
| 2014/0097536 A1 | 4/2014 | Schunk |
| 2014/0124818 A1 | 5/2014 | Hwang et al. |
| 2014/0154839 A1 | 6/2014 | Ahn et al. |
| 2014/0175655 A1 | 6/2014 | Chen et al. |
| 2014/0187040 A1 | 7/2014 | Enquist et al. |
| 2014/0217604 A1 | 8/2014 | Chou et al. |
| 2014/0225795 A1 | 8/2014 | Yu |
| 2014/0264836 A1 | 9/2014 | Chun et al. |
| 2014/0299981 A1 | 10/2014 | Goh et al. |
| 2014/0312511 A1 | 10/2014 | Nakamura |
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1* | 1/2015 | Lin .................. H01L 24/19 438/122 |
| 2015/0048500 A1 | 2/2015 | Yu et al. |
| 2015/0048503 A1 | 2/2015 | Chiu et al. |
| 2015/0064498 A1 | 3/2015 | Tong |
| 2015/0097022 A1 | 4/2015 | Di Cioccio et al. |
| 2015/0102468 A1 | 4/2015 | Kang et al. |
| 2015/0113195 A1 | 4/2015 | Kim |
| 2015/0130030 A1 | 5/2015 | Ma et al. |
| 2015/0130082 A1 | 5/2015 | Lu et al. |
| 2015/0145140 A1 | 5/2015 | Haba et al. |
| 2015/0162294 A1 | 6/2015 | Kawasaki |
| 2015/0171050 A1 | 6/2015 | Chen et al. |
| 2015/0171063 A1 | 6/2015 | Zhai et al. |
| 2015/0179481 A1 | 6/2015 | Lin |
| 2015/0194406 A1 | 7/2015 | Teh et al. |
| 2015/0200153 A1 | 7/2015 | Wang et al. |
| 2015/0200182 A1 | 7/2015 | Wang et al. |
| 2015/0206865 A1 | 7/2015 | Yu et al. |
| 2015/0235949 A1 | 8/2015 | Yu et al. |
| 2015/0235991 A1 | 8/2015 | Gu et al. |
| 2015/0262845 A1* | 9/2015 | Hwang ............ H01L 21/6835 438/113 |
| 2015/0270209 A1 | 9/2015 | Woychik et al. |
| 2015/0287672 A1 | 10/2015 | Yazdani |
| 2015/0287697 A1 | 10/2015 | Tsai et al. |
| 2015/0303174 A1 | 10/2015 | Yu et al. |
| 2015/0340285 A1 | 11/2015 | Enquist et al. |
| 2015/0371951 A1 | 12/2015 | Yeh et al. |
| 2016/0035687 A1 | 2/2016 | Lin et al. |
| 2016/0071770 A1 | 3/2016 | Albermann et al. |
| 2016/0093592 A1 | 3/2016 | Zhai |
| 2016/0126634 A1 | 5/2016 | Liu et al. |
| 2016/0141267 A1 | 5/2016 | Hagimoto et al. |
| 2016/0155724 A1 | 6/2016 | Kim et al. |
| 2016/0163650 A1 | 6/2016 | Gao et al. |
| 2016/0190103 A1 | 6/2016 | Kabe et al. |
| 2016/0218082 A1 | 7/2016 | Lee et al. |
| 2016/0233175 A1 | 8/2016 | Dubey et al. |
| 2016/0233196 A1 | 8/2016 | Kim et al. |
| 2016/0254249 A1 | 9/2016 | Jeng et al. |
| 2016/0260684 A1 | 9/2016 | Zhai et al. |
| 2016/0276296 A1 | 9/2016 | Woychik et al. |
| 2016/0300813 A1 | 10/2016 | Zhai et al. |
| 2016/0300817 A1 | 10/2016 | Do et al. |
| 2016/0315071 A1 | 10/2016 | Zhai et al. |
| 2016/0322330 A1 | 11/2016 | Lin et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2016/0343695 A1 | 11/2016 | Lin et al. |
| 2016/0351499 A1 | 12/2016 | Kitada |
| 2016/0358891 A1 | 12/2016 | Geissler et al. |
| 2016/0372323 A1 | 12/2016 | Doub et al. |

(56) References Cited

U.S. PATENT DOCUMENTS

| | | |
|---|---|---|
| 2017/0023405 A1 | 1/2017 | Fahim et al. |
| 2017/0062366 A1 | 3/2017 | Enquist |
| 2017/0062383 A1 | 3/2017 | Yee et al. |
| 2017/0084576 A1 | 3/2017 | Yu et al. |
| 2017/0179078 A1 | 4/2017 | Yu et al. |
| 2017/0125379 A1 | 5/2017 | Chen et al. |
| 2017/0141040 A1 | 5/2017 | Yu et al. |
| 2017/0148764 A1 | 5/2017 | Wang et al. |
| 2017/0148777 A1 | 5/2017 | Bono et al. |
| 2017/0179029 A1 | 6/2017 | Enquist et al. |
| 2017/0194271 A1 | 7/2017 | Hsu et al. |
| 2017/0200659 A1 | 7/2017 | Gaynes et al. |
| 2017/0200711 A1 | 7/2017 | Uzoh et al. |
| 2017/0200756 A1 | 7/2017 | Kao et al. |
| 2017/0243845 A1 | 8/2017 | Lee et al. |
| 2017/0250160 A1 | 8/2017 | Wu et al. |
| 2017/0250161 A1 | 8/2017 | Haba |
| 2017/0263518 A1 | 9/2017 | Yu et al. |
| 2017/0263595 A1 | 9/2017 | Kurita et al. |
| 2017/0284951 A1 | 10/2017 | Pindl et al. |
| 2017/0287874 A1 | 10/2017 | Fang et al. |
| 2017/0294422 A1 | 10/2017 | Solimando et al. |
| 2017/0330855 A1 | 11/2017 | Tung et al. |
| 2017/0338214 A1 | 11/2017 | Uzoh et al. |
| 2017/0345761 A1 | 11/2017 | Yu et al. |
| 2017/0358533 A1 | 12/2017 | Briggs et al. |
| 2017/0358553 A1 | 12/2017 | Kim et al. |
| 2017/0365580 A1 | 12/2017 | Shih et al. |
| 2017/0365582 A1 | 12/2017 | Seo et al. |
| 2017/0365591 A1 | 12/2017 | Chang et al. |
| 2018/0005984 A1 | 1/2018 | Yu et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0012863 A1 | 1/2018 | Yu et al. |
| 2018/0026008 A1 | 1/2018 | Jeng et al. |
| 2018/0053746 A1 | 2/2018 | Yu et al. |
| 2018/0061741 A1 | 3/2018 | Beyne |
| 2018/0068958 A1 | 3/2018 | Cho et al. |
| 2018/0068978 A1 | 3/2018 | Jeng et al. |
| 2018/0096931 A1 | 4/2018 | Huang et al. |
| 2018/0096988 A1 | 4/2018 | Long et al. |
| 2018/0122774 A1 | 5/2018 | Huang et al. |
| 2018/0130769 A1 | 5/2018 | Tan et al. |
| 2018/0130772 A1 | 5/2018 | Yu et al. |
| 2018/0138101 A1 | 5/2018 | Yu et al. |
| 2018/0151477 A1 | 5/2018 | Yu et al. |
| 2018/0158749 A1 | 6/2018 | Yu et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0269143 A1 | 9/2018 | Adams et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2018/0342435 A1 | 11/2018 | Yu et al. |
| 2018/0366436 A1 | 12/2018 | Wang et al. |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0043792 A1 | 2/2019 | Weerasekera et al. |
| 2019/0067247 A1 | 2/2019 | Yoo et al. |
| 2019/0088621 A1 | 3/2019 | Yang et al. |
| 2019/0096741 A1 | 3/2019 | Uzoh et al. |
| 2019/0096842 A1 | 3/2019 | Fountain, Jr. et al. |
| 2019/0103409 A1 | 4/2019 | Xu et al. |
| 2019/0109119 A1 | 4/2019 | Shih et al. |
| 2019/0115277 A1 | 4/2019 | Yu et al. |
| 2019/0123006 A1 | 4/2019 | Chen et al. |
| 2019/0131277 A1 | 5/2019 | Yang et al. |
| 2019/0157333 A1 | 5/2019 | Tsai |
| 2019/0189607 A1 | 6/2019 | Uzoh et al. |
| 2019/0198407 A1 | 6/2019 | Huang et al. |
| 2019/0198409 A1 | 6/2019 | Katkar et al. |
| 2019/0206791 A1 | 7/2019 | Pietambaram et al. |
| 2019/0221548 A1 | 7/2019 | Huang et al. |
| 2019/0237374 A1 | 8/2019 | Huang et al. |
| 2019/0265411 A1 | 8/2019 | Huang et al. |
| 2019/0267334 A1 | 8/2019 | Bowers |
| 2019/0319007 A1 | 10/2019 | Uzoh et al. |
| 2019/0333550 A1 | 10/2019 | Fisch |
| 2019/0333871 A1 | 10/2019 | Chen et al. |
| 2019/0341306 A1 | 11/2019 | Yu et al. |
| 2019/0341350 A1* | 11/2019 | Huang ............... H01L 23/5387 |
| 2019/0348336 A1 | 11/2019 | Katkar et al. |
| 2019/0355637 A1 | 11/2019 | Chen et al. |
| 2019/0355706 A1 | 11/2019 | Enquist et al. |
| 2019/0371763 A1 | 12/2019 | Agarwal et al. |
| 2019/0372000 A1 | 12/2019 | Yu et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006309 A1 | 1/2020 | Chen et al. |
| 2020/0013637 A1 | 1/2020 | Haba |
| 2020/0013667 A1 | 1/2020 | Leobandung |
| 2020/0013765 A1 | 1/2020 | Fountain, Jr. et al. |
| 2020/0035560 A1 | 1/2020 | Block et al. |
| 2020/0035641 A1 | 1/2020 | Fountain, Jr. et al. |
| 2020/0043853 A1 | 2/2020 | Kim et al. |
| 2020/0058617 A1 | 2/2020 | Wu et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0098736 A1 | 3/2020 | Liao et al. |
| 2020/0106156 A1 | 4/2020 | Lu et al. |
| 2020/0118973 A1 | 4/2020 | Wang et al. |
| 2020/0126906 A1 | 4/2020 | Uzoh et al. |
| 2020/0135684 A1 | 4/2020 | Kim et al. |
| 2020/0176419 A1 | 6/2020 | Dabral et al. |
| 2020/0185367 A1 | 6/2020 | Bhagavat et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0294920 A1 | 9/2020 | Hariri et al. |
| 2020/0303311 A1 | 9/2020 | Young et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395300 A1 | 12/2020 | Xie et al. |
| 2020/0395321 A1 | 12/2020 | Katkar et al. |
| 2020/0403006 A1 | 12/2020 | DeLaCruz et al. |
| 2020/0411483 A1 | 12/2020 | Uzoh et al. |
| 2021/0020577 A1 | 1/2021 | Hu |
| 2021/0028080 A1 | 1/2021 | Pietambaram et al. |
| 2021/0057309 A1 | 2/2021 | Hu et al. |
| 2021/0057343 A1 | 2/2021 | Chang et al. |
| 2021/0057352 A1 | 2/2021 | Agarwal et al. |
| 2021/0066219 A1 | 3/2021 | Chen et al. |
| 2021/0082797 A1 | 3/2021 | Lee et al. |
| 2021/0082822 A1 | 3/2021 | Aleksov et al. |
| 2021/0082825 A1 | 3/2021 | Strong et al. |
| 2021/0098411 A1 | 4/2021 | Liff et al. |
| 2021/0098412 A1 | 4/2021 | Haba et al. |
| 2021/0098421 A1 | 4/2021 | Wu et al. |
| 2021/0104487 A1 | 4/2021 | Uzoh et al. |
| 2021/0111125 A1 | 4/2021 | Chen et al. |
| 2021/0118832 A1 | 4/2021 | Chen et al. |
| 2021/0118864 A1 | 4/2021 | DeLaCruz et al. |
| 2021/0125933 A1 | 4/2021 | Chen et al. |
| 2021/0125965 A1 | 4/2021 | Lu |
| 2021/0134724 A1 | 5/2021 | Rubin et al. |

(56) References Cited

U.S. PATENT DOCUMENTS

| | | |
|---|---|---|
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202396 A1 | 7/2021 | Wu et al. |
| 2021/0225708 A1 | 7/2021 | Lee et al. |
| 2021/0225780 A1 | 7/2021 | Wu et al. |
| 2021/0242152 A1 | 8/2021 | Fountain, Jr. et al. |
| 2021/0280507 A1 | 9/2021 | Aldrete et al. |
| 2021/0280517 A1 | 9/2021 | May et al. |
| 2021/0280522 A1 | 9/2021 | Liu |
| 2021/0296282 A1 | 9/2021 | Gao et al. |
| 2021/0305122 A1 | 9/2021 | Lai et al. |
| 2021/0305202 A1 | 9/2021 | Uzoh et al. |
| 2021/0335726 A1 | 10/2021 | Wu et al. |
| 2021/0366820 A1 | 11/2021 | Uzoh |
| 2021/0366970 A1 | 11/2021 | Katkar |
| 2021/0375708 A1 | 12/2021 | Kuo et al. |
| 2021/0375737 A1 | 12/2021 | Lin |
| 2021/0384133 A1 | 12/2021 | Ong et al. |
| 2021/0384135 A1 | 12/2021 | Kuan et al. |
| 2021/0391271 A1 | 12/2021 | Hsu et al. |
| 2021/0391272 A1 | 12/2021 | Tsai et al. |
| 2021/0391283 A1 | 12/2021 | Hsu et al. |
| 2021/0391284 A1 | 12/2021 | Hsu et al. |
| 2021/0407941 A1 | 12/2021 | Haba |
| 2022/0005787 A1 | 1/2022 | Han et al. |
| 2022/0020729 A1 | 1/2022 | Gao et al. |
| 2022/0077063 A1 | 3/2022 | Haba |
| 2022/0077087 A1 | 3/2022 | Haba |
| 2022/0122934 A1 | 4/2022 | Haba |
| 2022/0139867 A1 | 5/2022 | Uzoh |
| 2022/0139869 A1 | 5/2022 | Gao et al. |
| 2022/0189941 A1 | 6/2022 | Enquist et al. |
| 2022/0199560 A1 | 6/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0278084 A1 | 9/2022 | Ong et al. |
| 2022/0285303 A1 | 9/2022 | Mirkarimi et al. |
| 2022/0293567 A1 | 9/2022 | Uzoh et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0375864 A1 | 11/2022 | Wang et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0130580 A1 | 4/2023 | Uzoh et al. |
| 2023/0131849 A1 | 4/2023 | Uzoh et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215739 A1 | 7/2023 | Haba et al. |
| 2023/0215836 A1 | 7/2023 | Haba et al. |
| 2023/0245950 A1 | 8/2023 | Haba et al. |
| 2023/0253367 A1 | 8/2023 | Gao et al. |
| 2023/0268300 A1 | 8/2023 | Uzoh et al. |
| 2023/0282610 A1 | 9/2023 | Uzoh et al. |
| 2023/0282634 A1 | 9/2023 | Enquist et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420399 A1 | 12/2023 | Haba et al. |
| 2024/0006377 A1 | 1/2024 | Wang et al. |
| 2024/0038702 A1 | 2/2024 | Uzoh |

FOREIGN PATENT DOCUMENTS

| | | |
|---|---|---|
| EP | 1011133 A1 | 6/2000 |
| EP | 2 339 614 A1 | 6/2011 |
| EP | 2 685 491 A2 | 1/2014 |
| JP | 04-337694 | 11/1992 |
| JP | 2000-100679 | 4/2000 |
| JP | 2001-102479 | 4/2001 |
| JP | 2001-284520 | 10/2001 |
| JP | 2002-353416 | 12/2002 |
| JP | 2002-359345 | 12/2002 |
| JP | 2004-193493 | 7/2004 |
| JP | 2007-294724 A | 11/2007 |
| JP | 2008-130603 A | 6/2008 |
| JP | 2009-135348 | 6/2009 |
| JP | 2010-034294 A | 2/2010 |
| JP | 2010-073964 | 4/2010 |
| JP | 2011-171614 | 9/2011 |
| JP | 2013-33786 | 2/2013 |
| JP | 2017-130610 | 7/2017 |
| JP | 2018-160519 | 10/2018 |
| KR | 10-2001-0104643 | 11/2001 |
| KR | 10-2004-0020827 | 3/2004 |
| KR | 10-2010-0123755 | 11/2010 |
| KR | 10-2015-0097798 | 8/2015 |
| KR | 10-2018-0054419 | 5/2018 |
| KR | 10-2020-0060670 | 6/2020 |
| KR | 10-2020-0092236 | 8/2020 |
| TW | I464810 B | 12/2014 |
| WO | WO 2005/043584 A2 | 5/2005 |
| WO | WO 2006/100444 A1 | 9/2006 |
| WO | WO 2008/112101 A2 | 9/2008 |
| WO | WO 2009/005898 A1 | 1/2009 |
| WO | WO 2010/024678 A1 | 3/2010 |
| WO | WO 2012/004964 A1 | 1/2012 |
| WO | WO 2014/052445 A1 | 4/2014 |
| WO | WO 2015/134227 A1 | 9/2015 |
| WO | WO 2017/034654 A1 | 3/2017 |
| WO | WO 2017/052652 A1 | 3/2017 |
| WO | WO 2017/151442 A1 | 9/2017 |
| WO | WO 2019/054364 | 3/2019 |

OTHER PUBLICATIONS

Braunisch, H. et al., "High-speed performance of silicon bridge die-to-die interconnects," 2011 IEEE, pp. 95-98.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

(56) References Cited

OTHER PUBLICATIONS

Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.
Fukushima, T. et al., "New three-dimensional integration technology using self-assembly technique," International Electron Devices Meeting 5-7.12.2005, IEEE, Dec. 5, 2005, pp. 348-351.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion mailed Apr. 22, 2019 in International Application No. PCT/US2018/064982, 13 pages.
International Search Report and Written Opinion mailed Oct. 25, 2019, issued in International Application No. PCT/US2019/040622, 12 pages.
International Search Report and Written Opinion mailed Oct. 22, 2021, issued in International Application No. PCT/US2021/038696, 10 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS ICS," IEEE Transactions on Components and Packaging Technologies, Jun. 2002, vol. 25, No. 2, pp. 309-316.
Khan et al., "Technologies for printing sensors and electronics over large flexible substrates," IEEE Sensors Journal, Jun. 2015, vol. 15, No. 6, pp. 3164-3185.
Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
NASA SBIR/STTR Technologies, Proposal No. 09-1 S5.05-9060—Reliable Direct Bond Copper Ceramic Packages for High Temperature Power Electronics, Contract No. NNX10CE23P, Pi: Ender Savrun, PhD, Sienna Technologies, Inc.—Woodinville, WA, 1 page.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
"Photo Etching DBC for Power Circuits—Direct Bond Copper (DBC) on Ceramic Used for Power Circuits," Conard Corporation, 2021, downloaded Nov. 9, 21, https://www.conardcorp.com/photo-etching-dbc-for-power-circuits/, 2 pages.
Plobi, A et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

(56) References Cited

OTHER PUBLICATIONS

Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Urteaga, M et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Bush, Steve, "Electronica: Automotive power modules from on Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Onsemi AR0820 image, cross section of a CMOS image sensor product. The part in the image was shipped on Sep. 16, 2021. Applicant makes no representation that the part in the image is|identical to the part identified in the separately submitted reference Bush, Nov. 8, 2018, ElectronicsWeekly.com ("Bush article"); however, the imaged part and the part shown in the Bush article share the part number "Onsemi AR0820.".
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".
Michailos, Jean, "Future landscape for 3D Integration: from Interposers to 3D High Density," 3d ASIP—Dec. 13-15, 2016, San Francisco Airport, USA, 46 pages.
Chang, T.C. et al., "A method for fabricating a superior oxide/nitride/oxide gate stack," Electrochemical and Solid-State Letters, 2004, vol. 7, No. 7, pp. G138-G140.
"Die-to-Wafer Fusion and Hybrid Bonding," EV Group, https://www.evgroup.com/technologies/die-to-wafer-fusion-and-hybrid-bonding/, printed Sep. 21, 2022, 8 pages.
Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.
Hooper, A. et al. "Review of wafer dicing techniques for via-middle process 3DI/TSV ultrathin silicon device wafers," 2015 IEEE 65th Electronic Components and Technology Conference (ECTC).
Jin, H. et al., "Silicon / Silicon Oxide / LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, 3 pages.
"Lecture 29: Productivity and process yield," National Programme on Technology Enhanced Learning (NPTEL), MM5017: Electronic materials, devices, and fabrication, 16 pages.
Lei, W.S. et al., "Die singulation technologies for advanced packaging: A critical review," J. Vac. Sci. Technol. B 30(4), Apr. 6, 2012, Jul./Aug. 1012, pp. 040801-1-040801-27.
"The effects of edge trimming—Engineering R&D Division, Operation V," Disco Technical Review Mar. 2016, 3 pages.

\* cited by examiner

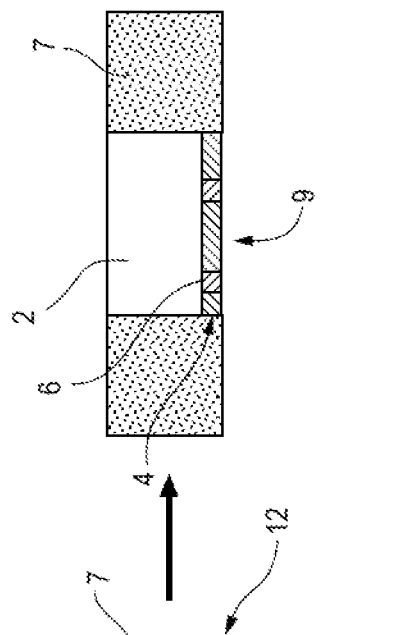
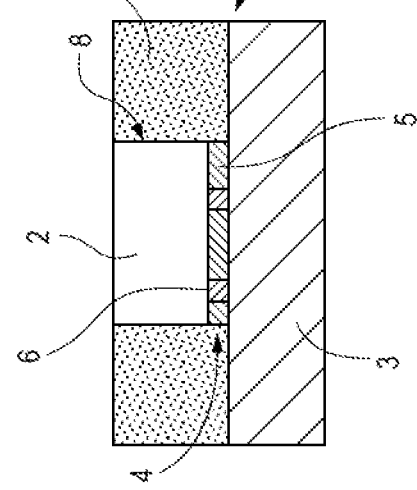
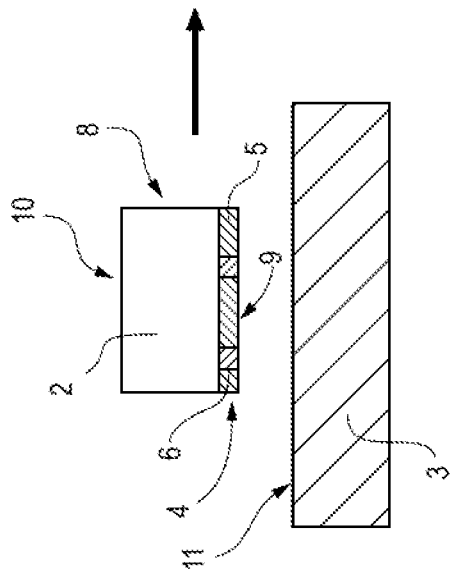

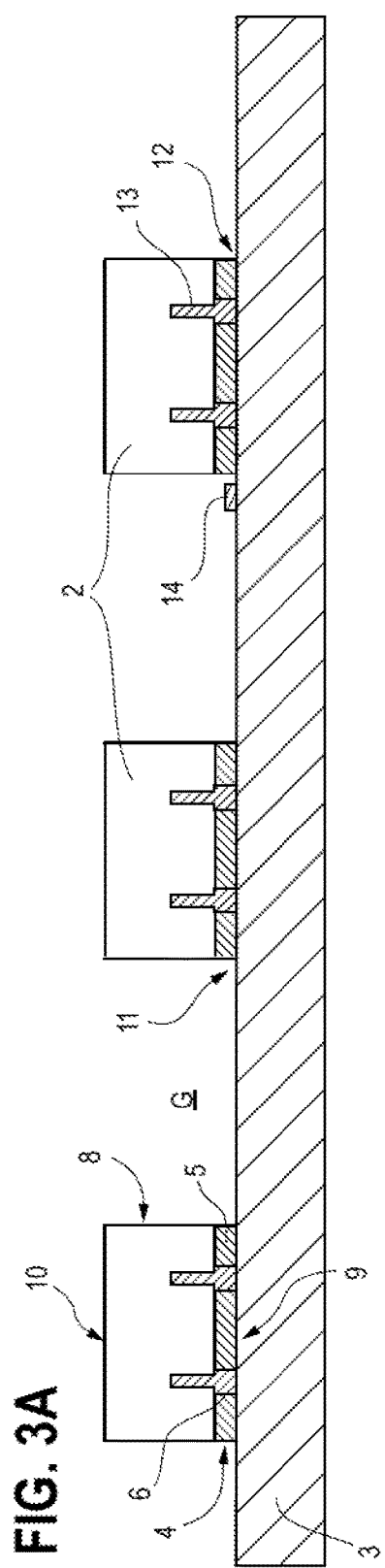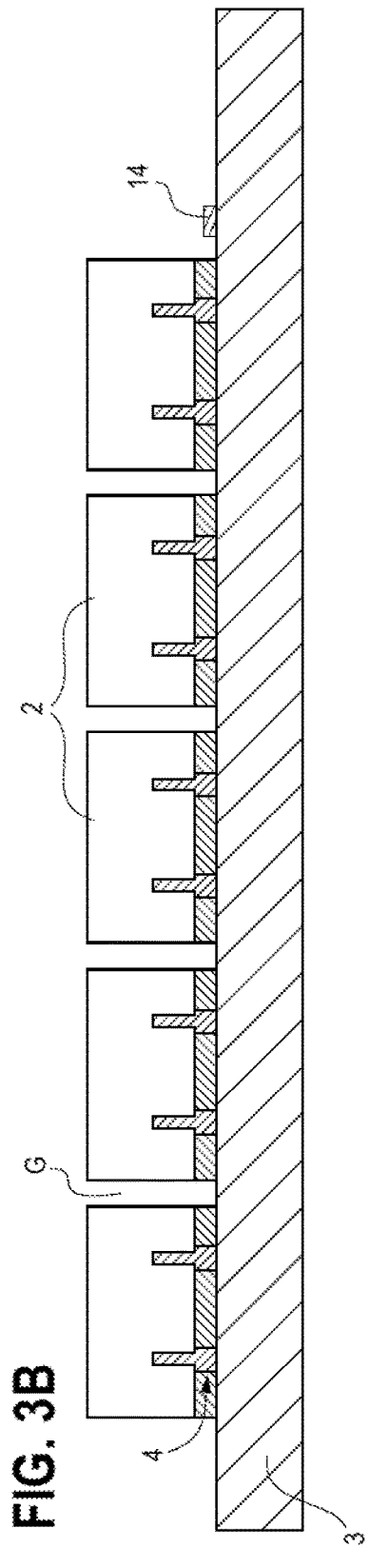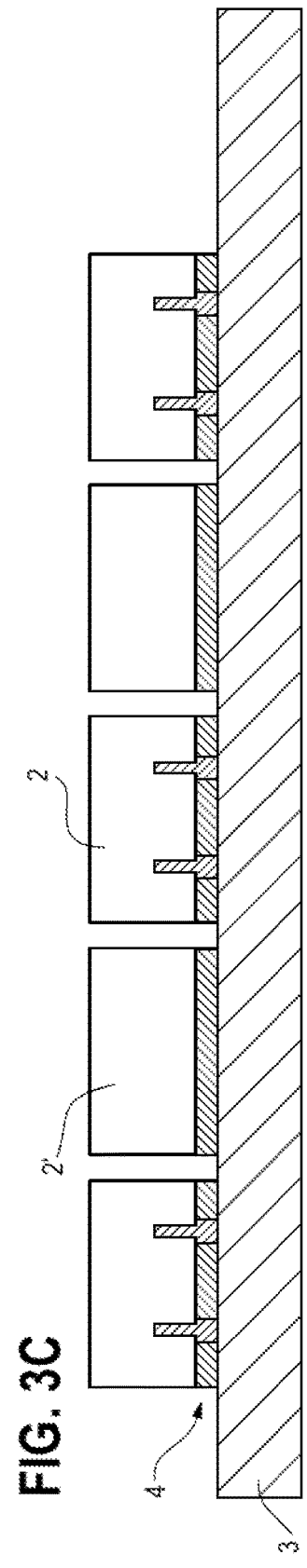

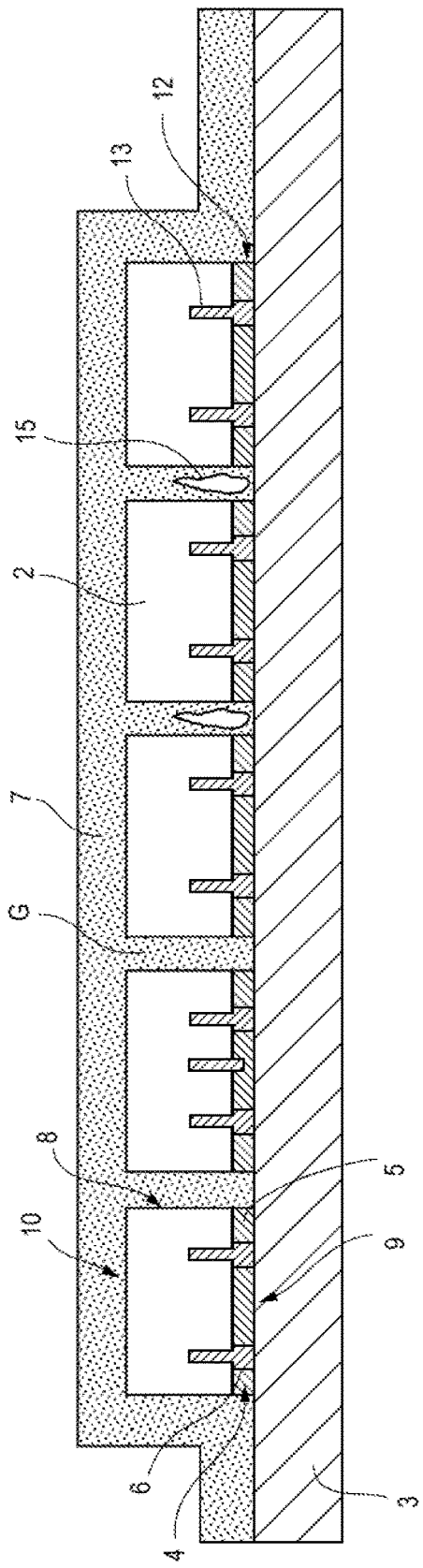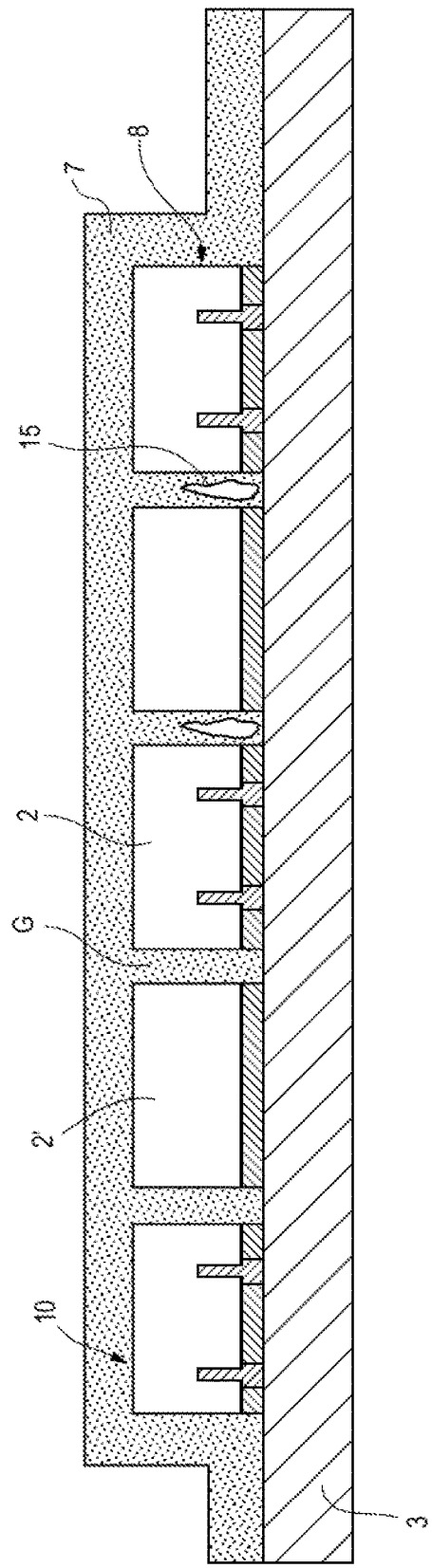

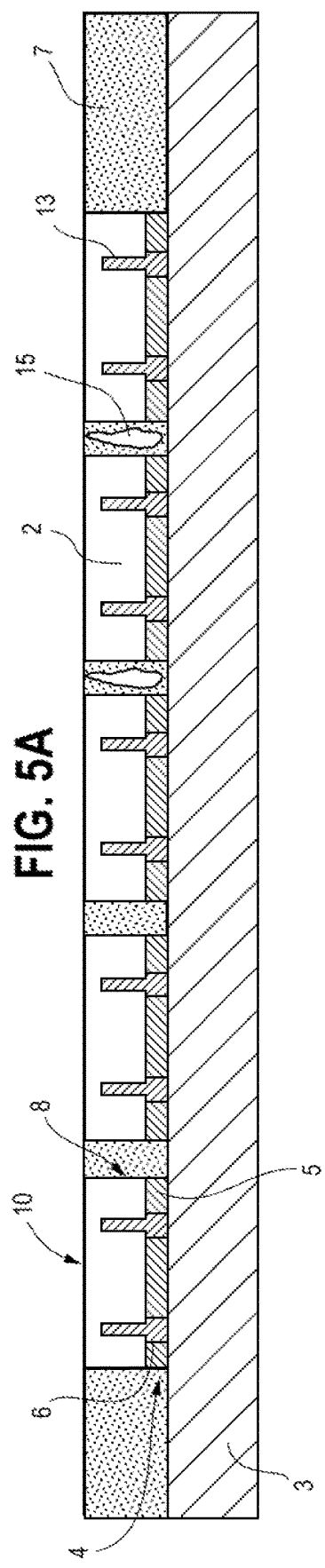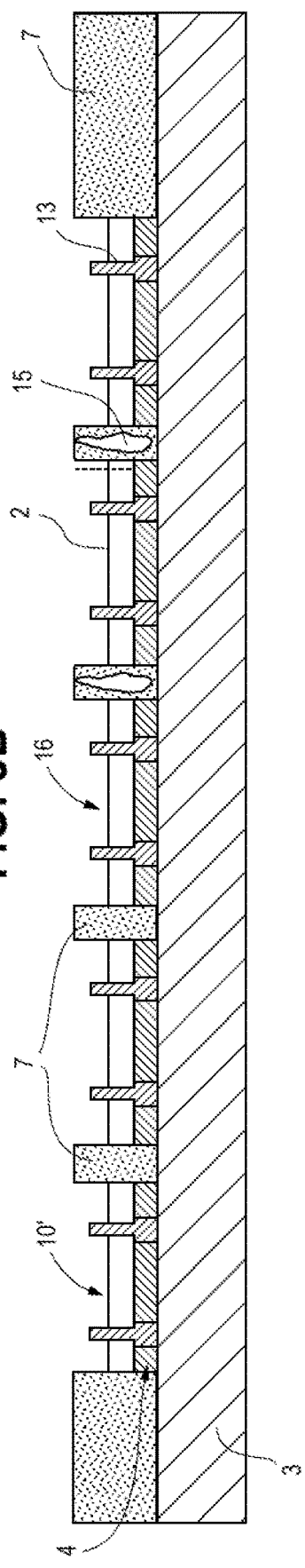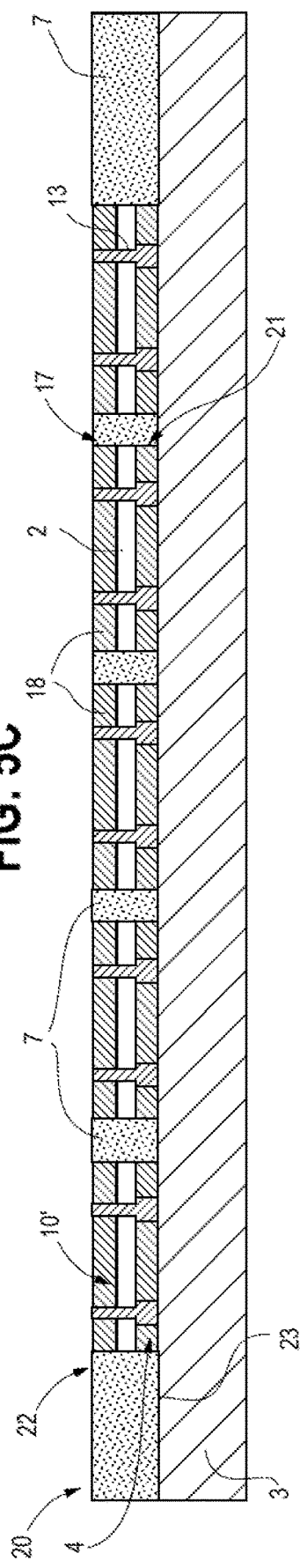

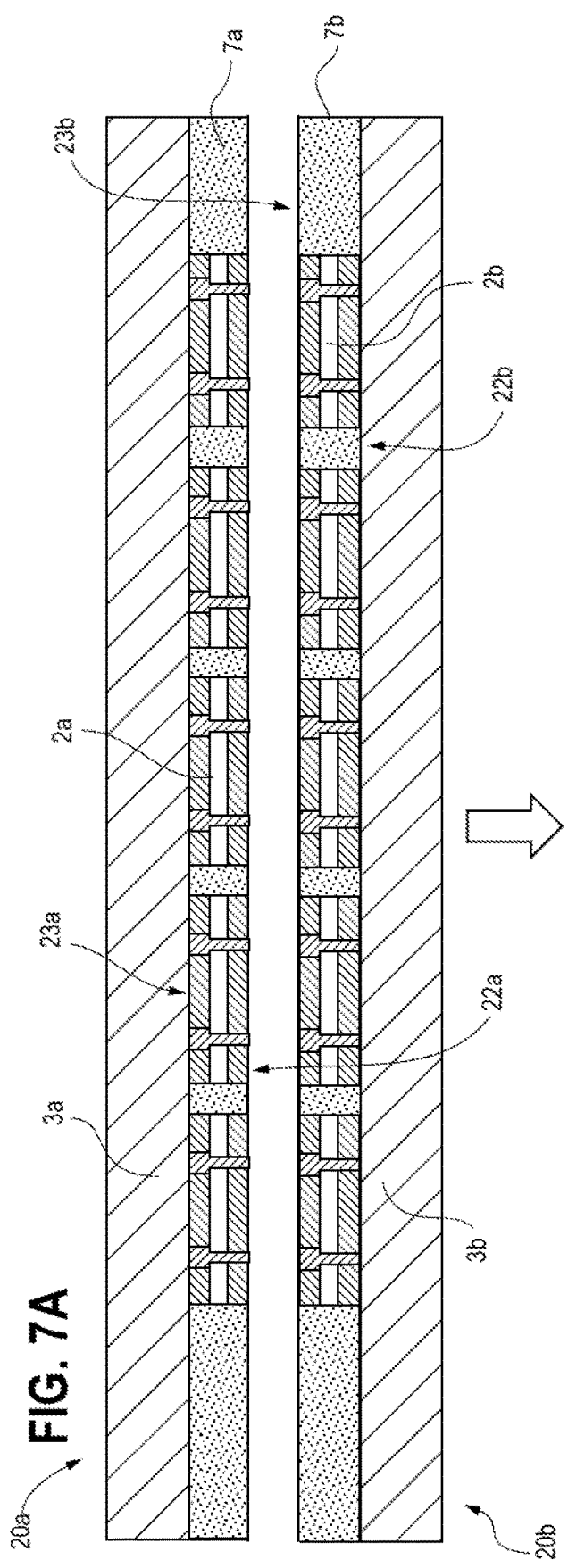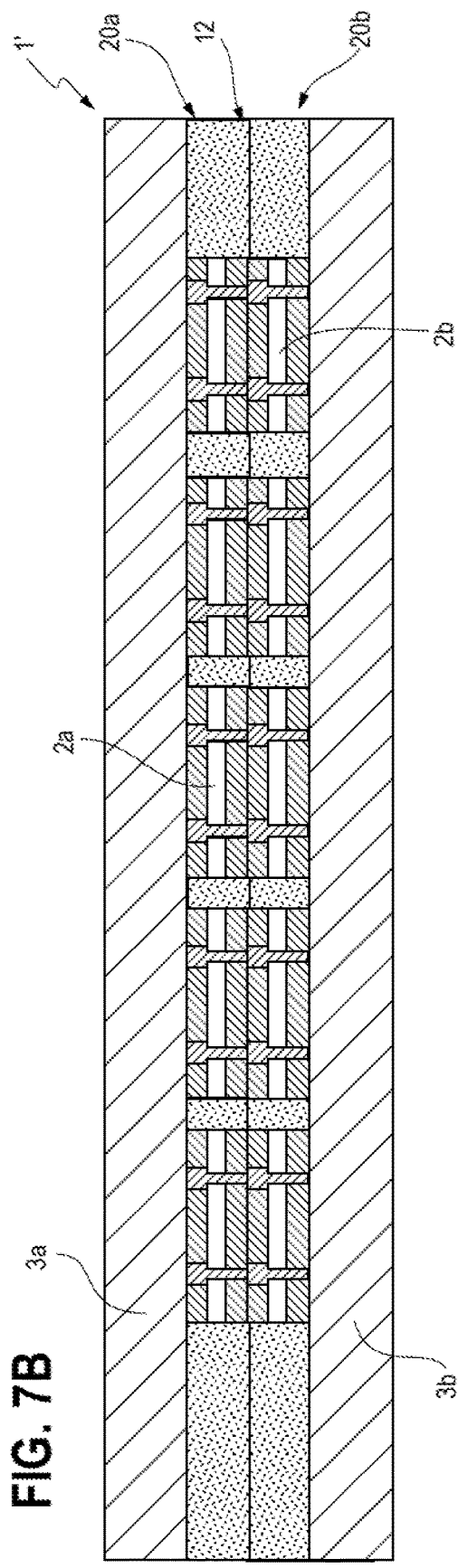

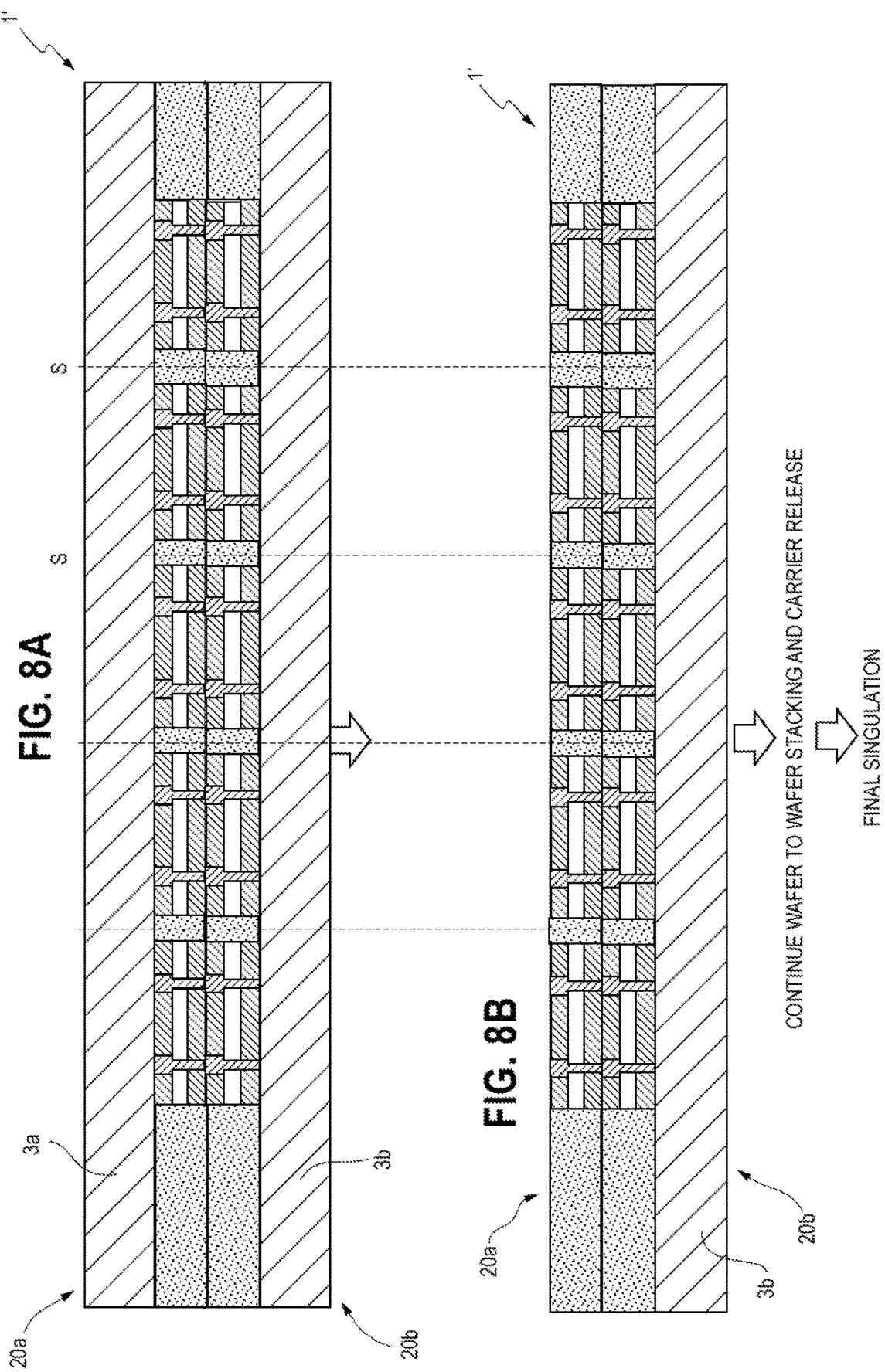

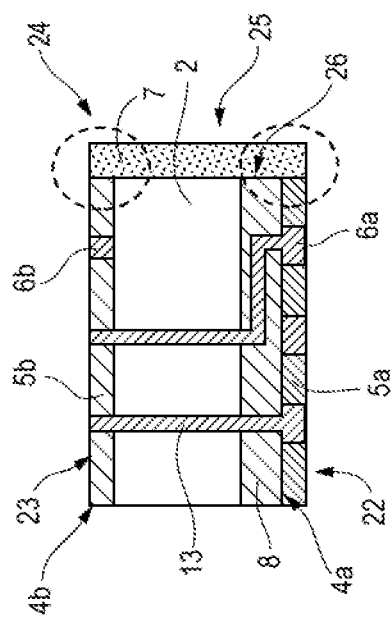
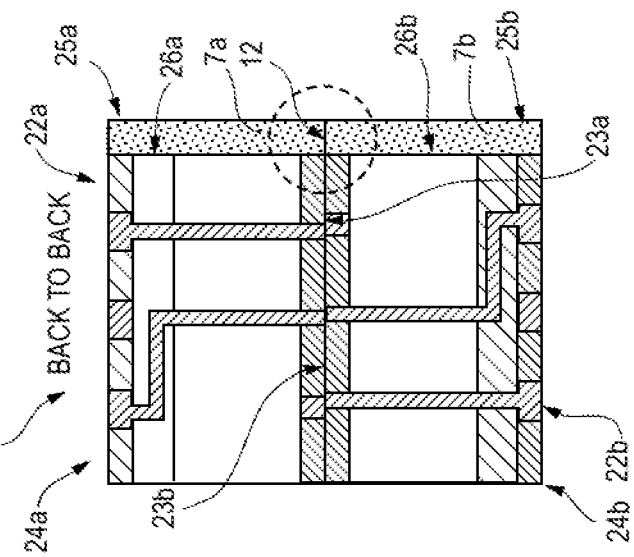
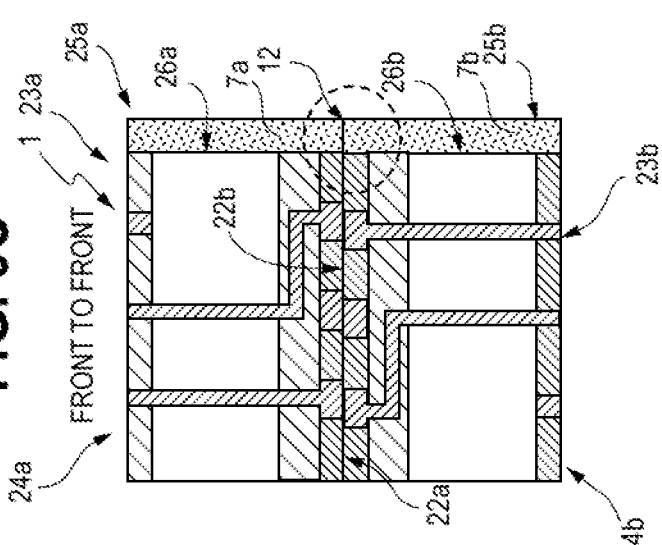
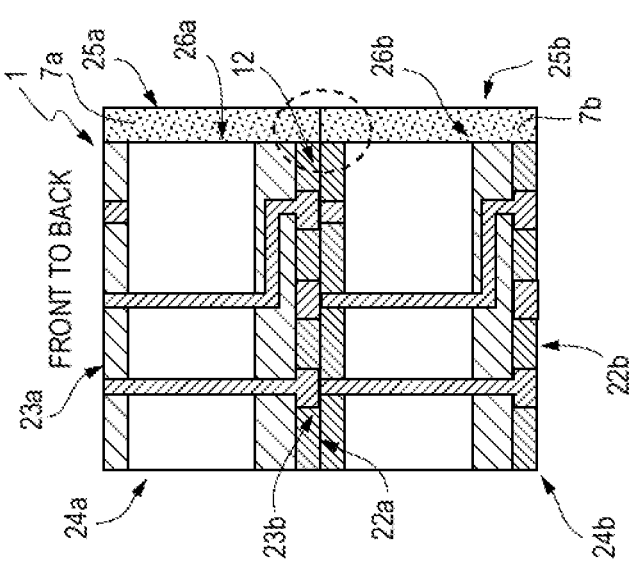

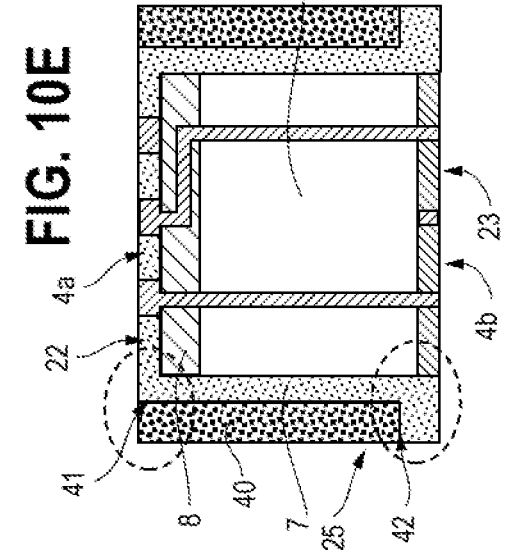
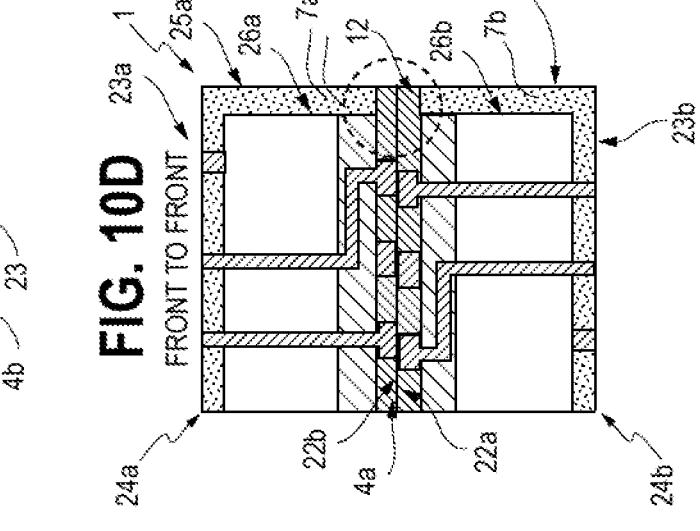
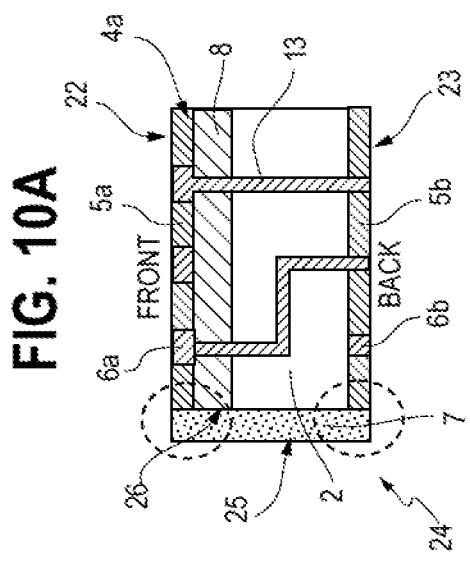
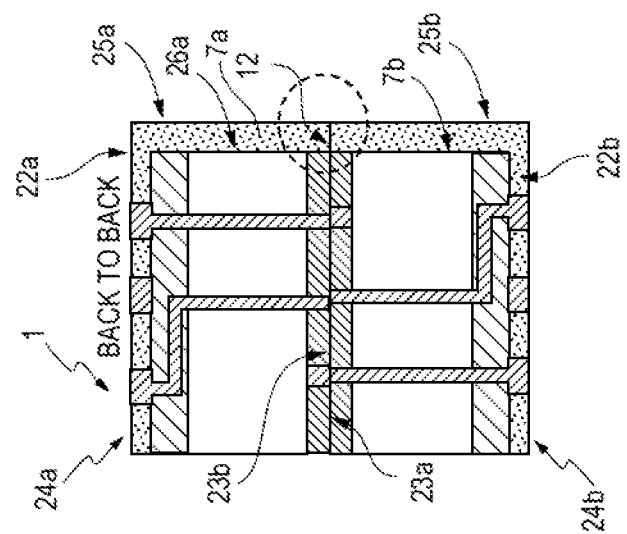
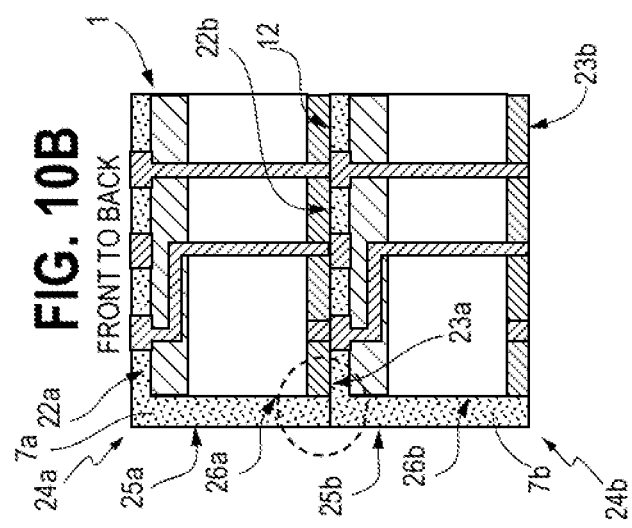

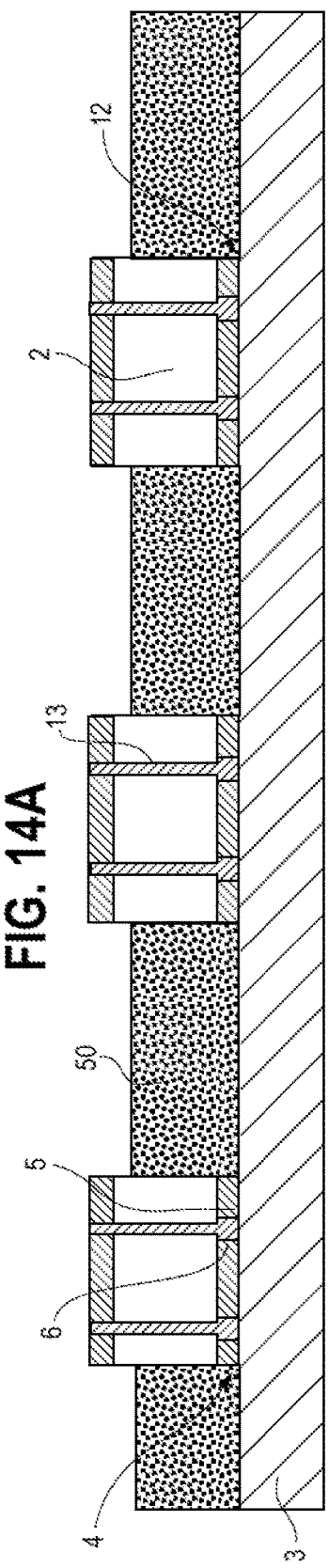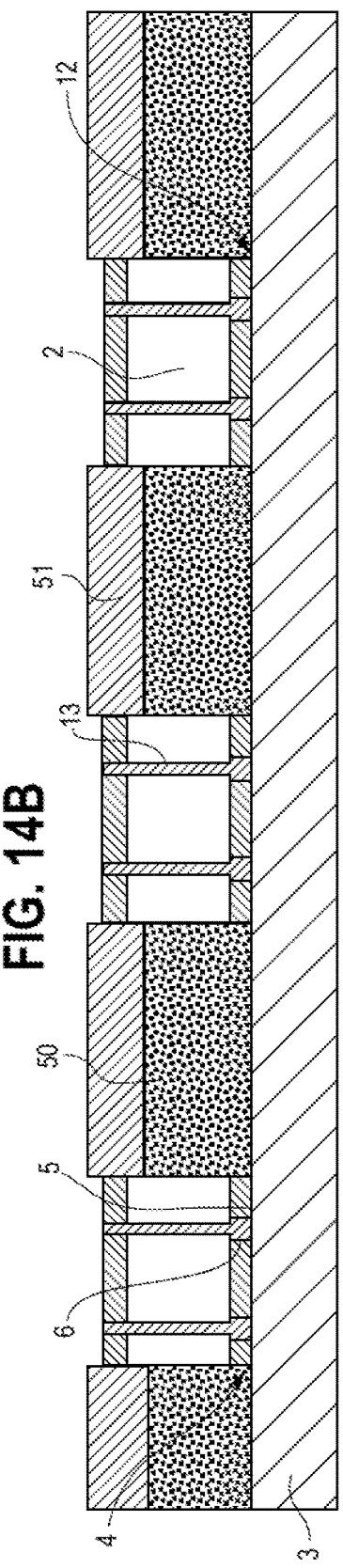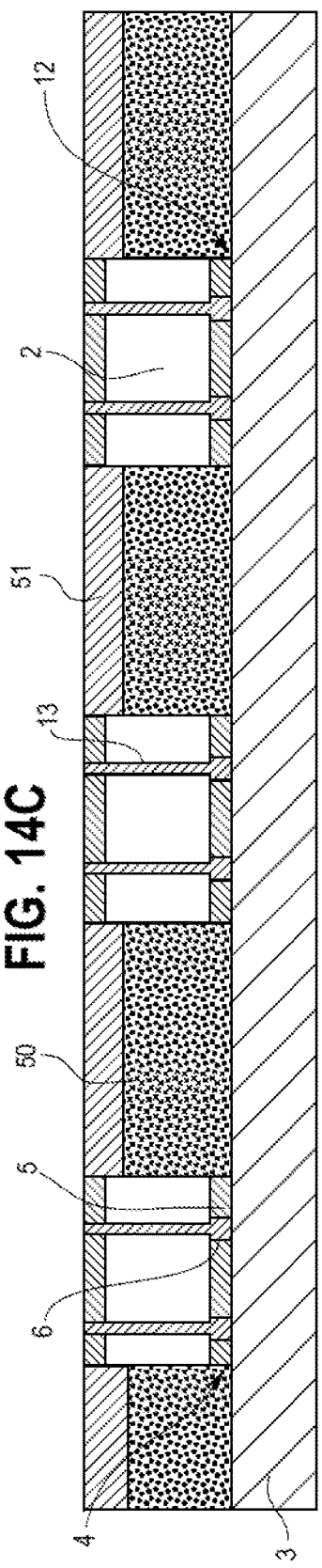

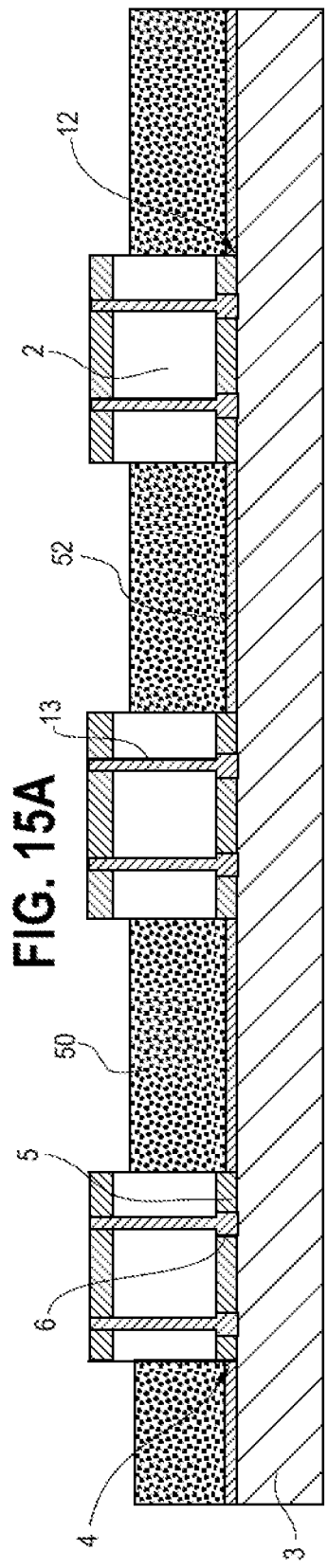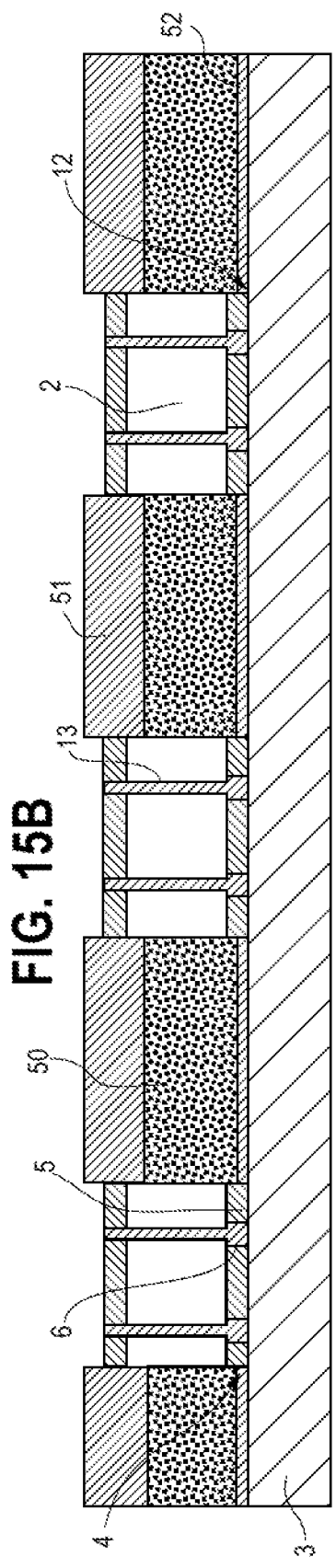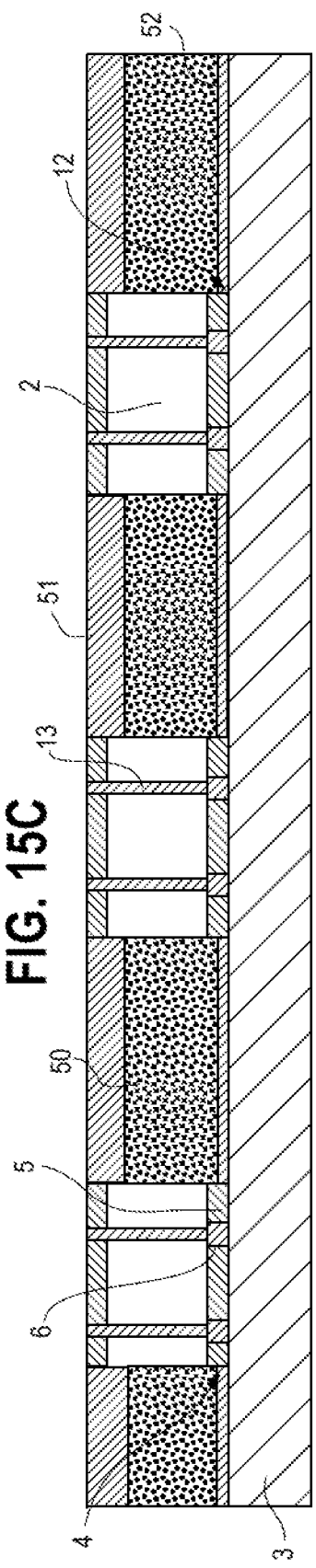

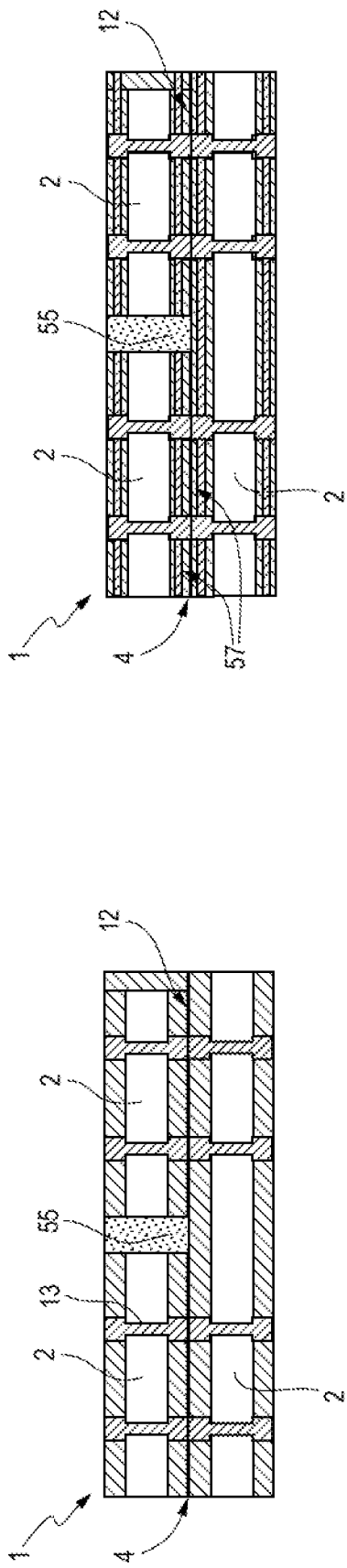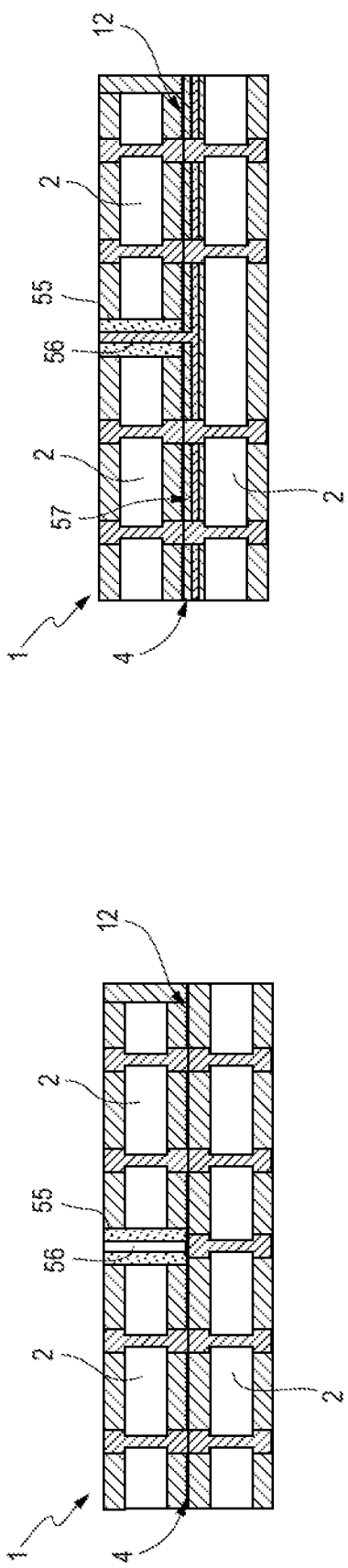

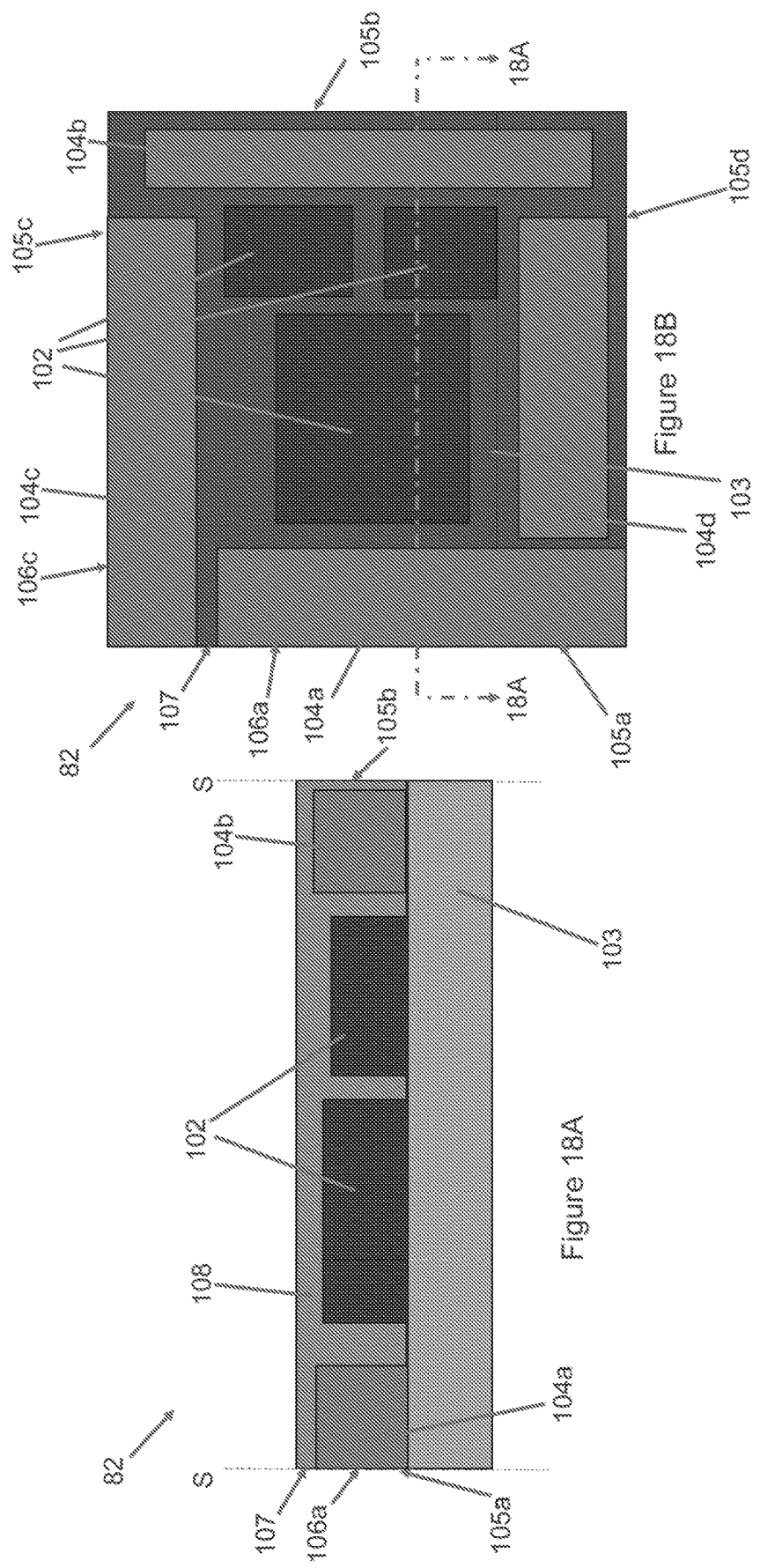

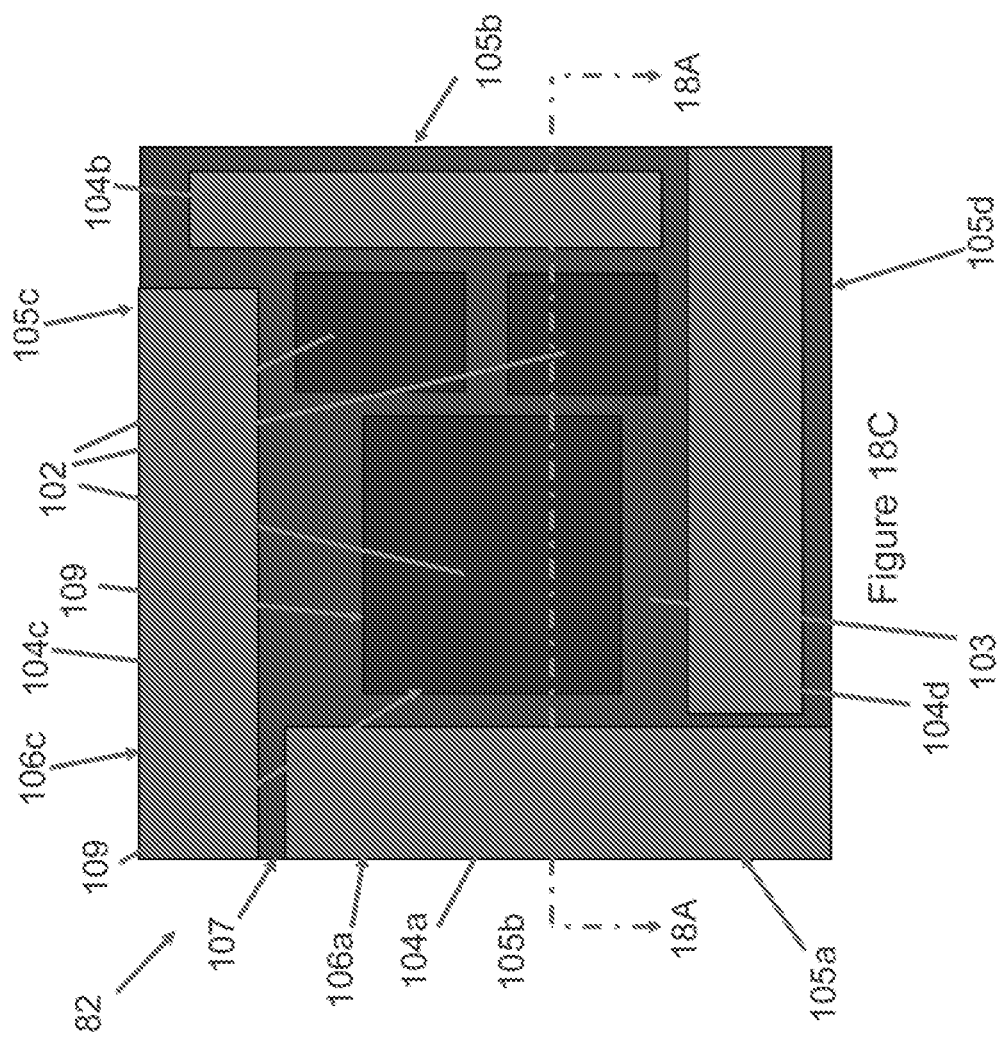

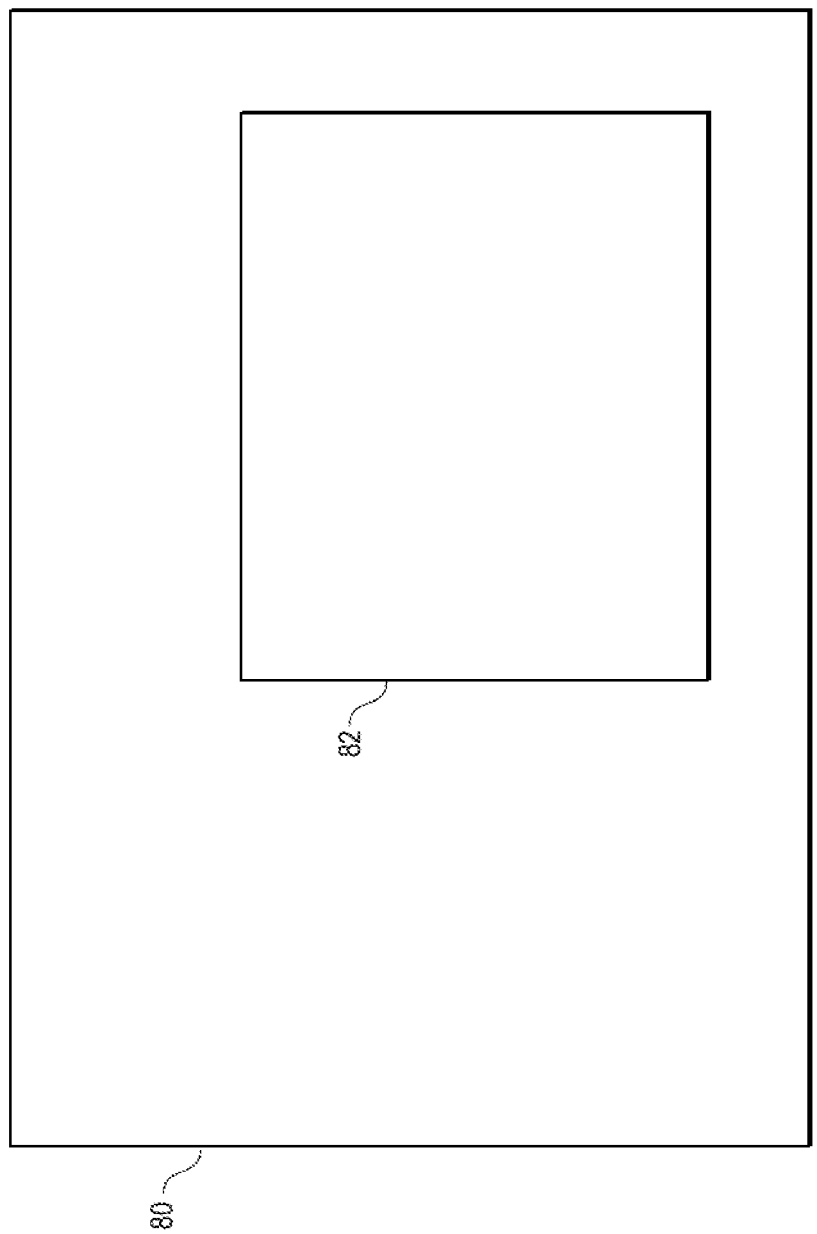

INTEGRATED DEVICE PACKAGES WITH INTEGRATED DEVICE DIE AND DUMMY ELEMENT

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The field relates to integrated device packages and methods for forming the same.

Description of the Related Art

In various packaging arrangements, it can be advantageous to arrange multiple integrated device dies within a package, e.g., system-in-package (SIPs). For example, some packages include different types of active chips or integrated device dies spaced apart from one another along a package substrate. In addition, three-dimensional (3D) integration techniques often utilize packages in which two or more integrated device dies are stacked on top of and electrically connected to one another. A molding compound or encapsulant can be provided over the integrated device dies, which can generate stresses in the package. Accordingly, there remains a continuing need for improved integrated device packages.

BRIEF DESCRIPTION OF THE DRAWINGS

These aspects and others will be apparent from the following description of preferred embodiments and the accompanying drawing, which is meant to illustrate and not to limit the invention, wherein:

FIGS. 1A-1C schematically illustrates the use of a sacrificial carrier in various direct bonding processes.

FIGS. 3A-3C show various examples in which elements are directly bonded to a carrier without an adhesive.

FIG. 4A is a schematic side view of a plurality of elements directly bonded to a carrier and with a protective material applied over the elements and within gaps between the elements.

FIG. 4B is a schematic side view of a plurality of elements that include one or more dummy elements directly bonded to a carrier.

FIGS. 5A-5C illustrate a series of processing steps for forming a reconstituted wafer.

FIG. 7A illustrates two opposing reconstituted wafers prior to direct bonding.

FIG. 7B illustrates the two opposing reconstituted wafers after being directly bonded to one another.

FIGS. 8A-8B illustrate methods and structures for stacking more than two reconstituted wafers, according to various embodiments.

FIGS. 9A-9F illustrate various face up bonded structures, according to various embodiments.

FIGS. 10A-10E illustrate various face down bonded structures, according to various embodiments.

FIGS. 14A-14C illustrate another embodiment in which a mold compound can be provided between adjacent elements directly bonded to a carrier, and a metal can be provided on the mold compound.

FIGS. 15A-15C illustrate another embodiment in which a mold compound can be provided between adjacent elements directly bonded to a carrier, and a metal can be provided on both sides of the mold compound.

FIGS. 17A-17D illustrates additional bonded structures that can be provided with the methods disclosed herein.

FIG. 18A is a schematic side sectional view of an integrated device package, according to another embodiment.

FIG. 18B is a schematic top plan view of the integrated device package of FIG. 18A, with the molding compound hidden for ease of illustration.

FIG. 18C is a schematic top plan view of an integrated device package that includes increased lateral overlap among stress compensation elements.

FIG. 19 is a schematic diagram of a system incorporating one or more bonded structures, according to various embodiments.

DETAILED DESCRIPTION

Figure 2:
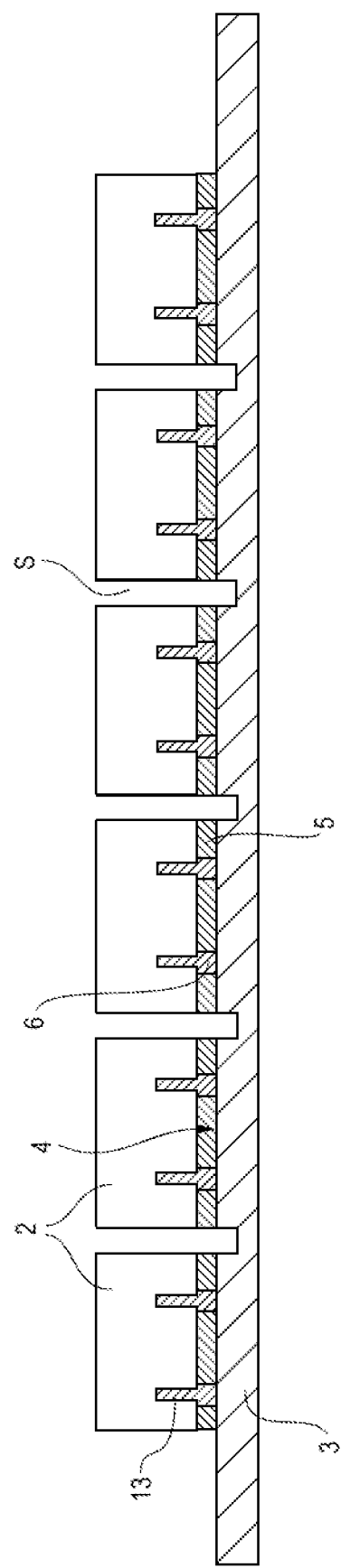
FIG. 2 illustrates a plurality of elements directly bonded to a carrier.

Various embodiments disclosed herein relate to a bonded structure comprising a first element (e.g., a first integrated device die) having a first side and a second side opposite the first side. The bonded structure can include a second element (e.g., a second integrated device die) having a first side and a second side opposite the first side. The first side of the second integrated device die can be directly bonded to the first side of the first integrated device die without an intervening adhesive along a bonding interface. A protective material can be disposed about a periphery (e.g., respective sidewalls) of the first and second integrated device dies. The protective material can extend from the second side of the first integrated device die to the second side of the second integrated device die. In various embodiments, portions of the protective material can be disposed within gaps between adjacent first integrated device dies or elements. In some embodiments, the protective material can comprise an inorganic dielectric, such as silicon dioxide, silicon nitride, polysilicon, amorphous silicon, etc.

The embodiments disclosed herein can comprise wafer-level processes in which wafers or substrates, serving as carriers, are provided with a plurality of integrated device dies and a protective material (which can comprise one or a plurality of protective layers) over the integrated device dies. The die(s) and protective material can form at least a portion of a reconstituted wafer which can be bonded (e.g., directly bonded without an adhesive) to another reconstituted wafer formed by a similar process. The bonded reconstituted wafers can be singulated to form a plurality of bonded structures, for example after removal of the carriers. The bonded structures can comprise packaging structures in some embodiments. As used herein, direct bond interconnects, or DBI®, can comprise bonded structures in which densely dispersed conductive contacts are bonded to one another without an intervening adhesive. In various embodiments, the surrounding dielectric or nonconductive materials can also be directly bonded without an intervening adhesive. A ZiBond® process can comprise a direct bond between nonconductive materials without an intervening adhesive. Examples of DBI and ZiBond processes and structures may be found throughout at least U.S. Pat. Nos. 9,391,143; 10,141,218; 10,147,641; 9,431,368; and 7,126,212, the entire contents of each of which are incorporated by reference herein in their entireties and for all purposes. Each of the singulated dies mounted on the carriers can be tested prior to mounting, such that all dies in the reconstituted wafer can be Known Good Dies (KGD).

FIGS. 1A-1C schematically illustrate the use of a sacrificial carrier 3 in various direct bonding processes. As shown, in some embodiments, an element 2 can be directly bonded to a carrier 3 without an adhesive. Throughout this application, the element 2 (or any of the other elements described herein) can comprise any suitable type of element, such as a semiconductor element (e.g., an integrated device die), an optical element, etc. The carrier 3 can comprise any suitable type of carrier, such as a carrier with one or more logic or processing devices, and/or a sacrificial carrier (e.g., a carrier without active processing circuitry) that is to be removed at some point during processing.

The element 2 can comprise a front side 9 and a back side 10 opposite the front side 9. In various embodiments, the front side 9 can comprise a surface nearest to active circuitry or devices formed in the element 2. A first front bonding layer 4 can be provided at the front side 9 of the element 2. Although the bonding layer 4 is shown at the front side 9 of the element 2, a bonding layer may also or alternatively be provided on the back side 10 for bonding. The bonding layer 4 can comprise one or a plurality of contact pads 6 disposed within or surrounded by a nonconductive field region 5. In some embodiments, the contact pads can comprise copper, although other conductive materials are suitable. In some embodiments, the nonconductive field region can comprise a dielectric such as silicon oxide, silicon nitride, etc. The back side 10 may or may not include active circuitry or devices. In various embodiments, the element 2 can comprise a singulated element (such as a singulated device die) having a side surface 8. The side surface 8 can comprise markings indicative of a singulation process, for example, saw markings, etch patterns, etc.

As explained above, and as shown in FIG. 1A, the element 2 (e.g., a die) can be directly bonded to the carrier 3 without an intervening adhesive along a bond interface 12. The front bonding layer 4 can be prepared for bonding, as explained above. For example, the front bonding layer 4 can be polished to a very low surface roughness and processed so as to enhance dielectric-to-dielectric direct bonding. In some embodiments, the surfaces to be bonded may be terminated with a suitable species and activated prior to bonding. For example, in some embodiments, the surfaces to be bonded may be very lightly etched for activation and exposed to a nitrogen-containing solution and terminated with a nitrogen-containing species. As one example, the surfaces to be bonded may be exposed to an ammonia dip after a very slight etch, and/or a nitrogen-containing plasma (with or without a separate etch).

Once the surfaces are prepared, the nonconductive field region 5 of the element 2 can be brought into contact with corresponding nonconductive regions of the carrier 3. The interaction of the activated surfaces can cause the nonconductive region 5 of the element 2 to directly bond with the corresponding nonconductive regions of the carrier 3 without an intervening adhesive, without application of external pressure, without application of voltage, and at room temperature. In various embodiments, the bonding forces of the nonconductive regions can be covalent bonds that are greater than Van der Waals bonds. In some embodiments, only nonconductive field regions of the element 2 are directly bonded to corresponding nonconductive regions of the carrier 3. In other embodiments, however, contact pads 6 of the element 2 can be directly bonded to corresponding conductive contacts of the carrier 3, and the nonconductive region 5 can also be directly bonded to the nonconductive regions of the carrier 3. In such embodiments, direct bonding of the contacts can improve alignment of the element 2 relative to the carrier 3. In the embodiments disclosed herein, the use of direct bonding can reduce movement during assembly as compared to implementations that utilize an intervening adhesive.

As shown in FIG. 1B, a protective material 7 can be applied over at least a portion of the element 2, including about at least a periphery or side surface 8 of the element 2. In some embodiments, the protective material 7 can be deposited along the side surface 8 and over an upper surface of the carrier 3. The protective material 7 can comprise one or more protective layers, including one or more inorganic layers, such as silicon oxide, silicon nitride, polysilicon, amorphous silicon, a metal, etc.

As shown in FIG. 1C, the carrier 3 can be removed from the element 2 and the protective material 7 in any suitable manner. In the illustrated embodiment, the carrier 3 can comprise a silicon substrate or element with a nano oxide layer 11, which as used herein can include at least one of a native silicon oxide layer and a thermal silicon oxide layer. Each of the embodiments disclosed herein can utilize such a carrier with nano oxide layer 11. In some embodiments, in the carrier removal process the carrier 3 can be selectively etched using the silicon nano oxide layer 11 as an etch stop. In some embodiments, at least a portion of the nano oxide 11 layer can remain after removing the silicon base material of the carrier 3. In other embodiments, the entirety of the carrier 3 (e.g., the silicon base material and the nano oxide layer 11) can be removed. In embodiments that utilize a nano oxide layer 11, the element 2 can be planarized for bonding, but the carrier 3 may not be planarized prior to direct bonding. In other embodiments, both the element 2 and carrier 3 can be planarized for direct bonding. Direct bonding and subsequent removal of the carrier 3 as described herein can advantageously leave a planar surface for a reconstituted wafer for further processing as desired, including for additional direct bonding processes. In contrast, reconstituted wafers formed on sacrificial or temporary adhesive layers (e.g., tape or film) do not reliably provide planar surfaces and thus can lead to subsequent alignment issues, e.g., for subsequent direct bonding of dies for stacking. Such stacking with direct bonding could be by way of direct bonding individual second dies on a first reconstituted wafer, or simultaneously bonding multiple second dies in a second reconstituted wafer.

Beneficially, the embodiment of FIGS. 1A-1C can enable the reconstitution of wafers for direct bonding with improved alignment accuracy. For example, although only one element 2 or die is shown in FIGS. 1A-1C, it should be appreciated that an array of multiple dies can be provided, and as shown below. In other applications in which an adhesive is used to bond the elements 2 (e.g., dies) to the carrier 3, the elements 2 or dies may become misaligned relative to the carrier 3 due to movement or migration of the adhesive, for example, during or after heating or during placement for bonding. Such misalignments can result in misalignment for subsequently bonded structures and negatively affect the performance of the bonded structures. The embodiments disclosed herein can beneficially reduce misalignment by providing a direct bond interconnection with the carrier 3, which can serve to effectively fix the element 2 or die relative to the carrier 3 for subsequent processing, such as providing a protective material 7 (inorganic or organic) over the element 2, or any other suitable processing.

FIG. 2 illustrates a plurality of elements 2 directly bonded to a carrier 3, such as a wafer. Unless otherwise noted, reference numerals in FIG. 2 may represent components that are the same as or generally similar to like-numbered components of FIGS. 1A-1C. In FIG. 2, each element 2 can include one or more conductive vias 13 connected to back side(s) of corresponding contact pads 6. As shown in FIG. 2, the conductive vias may initially extend upwardly from the contact pad and terminate within the body of the element 2. After the directly bonding, the dies or elements 2 can be diced or singulated into a plurality of diced or singulated elements 2. As explained herein, the removal of a silicon substrate using the nano oxide layer 11 may leave a substantially smooth surface for subsequent direct bonding.

FIGS. 3A-3C show various examples in which elements 2 (e.g., integrated device dies) are directly bonded to a carrier 3 (e.g., a silicon substrate with nano oxide layer 11) without an intervening adhesive. FIG. 3A illustrates a relatively wide separation or gap G between elements 2, while FIG. 3B illustrates a relatively narrow separation or gap G between elements 2. FIG. 3C illustrates additional dummy elements 2' or dies disposed between active elements 2 or dies, with relatively narrow gaps G therebetween. Providing the narrow gaps G in FIGS. 3B and 3C can beneficially reduce the amount of protective material 7 used to fill the gaps G in subsequent steps and can enable conformal filling of the gaps G. Further, as shown in FIGS. 3A and 3B, one or more alignment feature(s) 14 can be provide on the upper surface of the carrier 3. The alignment features 14 can be selectively positioned on the carrier 3 to assist in accurate placement of the elements 2.

FIG. 4A is a schematic side view of a plurality of elements 2 directly bonded to a carrier 3 and with a protective material 7 applied over the elements 2 and within the gaps G between the elements 2. In FIG. 4A, the elements 2 are illustrated as being all active integrated device dies. In FIG. 4B, some of the elements comprise dummy elements 2', such as inactive blocks of semiconductor material (e.g., silicon). In FIGS. 4A and 4B, a protective layer 7 (such as an inorganic protective layer) can be provided over portions of the elements 2, including around a portion of the periphery (e.g., the side surface 8) within the gaps G and over upper surfaces (which are the back sides 10 in FIGS. 4A-4B) of the elements 2. Seams 15 such as voids or discontinuities may be present in the protective material 7.

The protective layer 7 can include one or a plurality of protective layers, including, e.g., inorganic or organic protective layer(s). In the illustrated embodiment, for example, the protective layer 7 can comprise inorganic layer(s) such as silicon oxide, silicon nitride, polysilicon, amorphous silicon, or a metal. In other embodiments, at least a portion of the protective material 7 can comprise an organic material, such as a molding compound or epoxy. In some embodiments, the protective material 7 comprises both a conformal layer and a gap-fill layer. Beneficially, the protective material 7 can assist in affixing the elements 2 to the carrier 3 such that the elements 2 do not shift during subsequent direct bonding processes. The protective material 7 can also assist in protecting the elements 2 during polishing and other processing techniques to prevent damage to the dies (e.g., chipping). Examples of structures and processes for providing protective material 7 on and between adjacent directly bonded dies over a carrier, for use in conjunction with post-bonding thinning and/or singulation processes, are disclosed in U.S. Pat. No. 10,204,893, the entire contents of which are hereby incorporated by reference herein in their entirety and for all purposes.

FIGS. 5A-5C illustrate a series of processing steps for forming a reconstituted wafer 20. The reconstituted wafer 20 can be bonded (e.g., directly bonded) to another reconstituted wafer 20 or to other substrates in subsequent steps. In FIG. 5A, the upper surfaces of the conformal protective material 7 can be removed, e.g., by etching, lapping, grinding, polishing, etc. In some embodiments, the removal of the protective material 7 can also remove a portion of the back side 10 of the elements 2. In other embodiments, the removal step can terminate at the back side 10 of the element 2.

Turning to FIG. 5B, a portion of the element 2 from the back side 10 can be removed by etching, lapping, chemical mechanical polishing (CMP), or any other suitable method, to form a thinned back side 10' of the element 2. As shown in FIG. 5A, this removal step can expose the conductive through substrate vias (TSVs) 13 or other electrical interconnects formed within the elements. The removal step can also form a cavity 16 defined at least in part by the thinned back side 10' of the element 2 and side walls of the protective material 7. In FIG. 5C, a nonconductive layer 18 (e.g., a second oxide layer) can be provided (e.g., deposited) over the thinned back sides 10' of the elements 2 and around the exposed vias 13. In some embodiments, the provided nonconductive layer 18 (for example, silicon oxide) can be lapped or polished to generate a planar surface and to ensure that the nonconductive layer 18 is generally planar relative to the exposed ends of the vias 13 and the protective material.

In FIG. 5C, the reconstituted wafer 20 can comprise a front surface 22 configured to be bonded (e.g., direct bonded) to another reconstituted wafer or other type of substrate. The reconstituted wafer 20 can also comprise a back surface 23. In the reconstituted wafer 20 of FIG. 5C, the protective material 7 can be disposed between adjacent elements 2 and can extend from the front surface 22 of the reconstituted wafer 20 to the upper surface of the carrier 3. A vertical interface 19 can be defined between the nonconductive layer 18 over the element 2 and the protective material 7. Similarly, a vertical interface 21 can be defined between the bonding layer 4 and the protective material 7.

Figure 6:
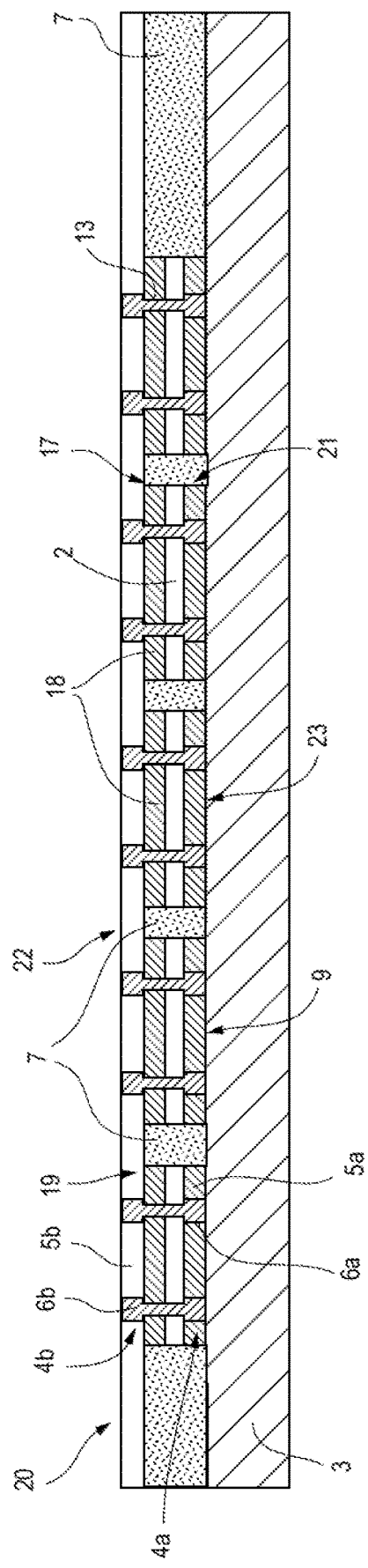
FIG. 6 is a schematic side sectional view of a reconstituted wafer having a bonding layer configured to directly bond to another reconstituted wafer or substrate.

FIG. 6 is a schematic side sectional view of a reconstituted wafer having a second bonding layer 4b configured to directly bond to another reconstituted wafer or substrate. The first bonding layer 4, the contacts 6, and the nonconductive field region 5 of FIGS. 1A-5 have been renumbered as reference numerals 4a, 6a, and 5a, respectively, in FIG. 6. As shown in FIG. 6, in some embodiments, the second bonding layer 4b, e.g., a DBI layer having alternating conductive contacts 6b and nonconductive bonding portions (e.g., field regions 5b), can be provided over the nonconductive layer 18 (e.g., a second oxide layer) to facilitate additional bonding connections, if desired, to provide bonding pads conducive to DBI alignment. Thus, in FIG. 6, the second bonding layer 4b can extend across multiple (e.g., all) of the elements 2 of the reconstituted wafer 20. A horizontal interface 19 can be formed between the second bonding layer 4b and the nonconductive layer 18, and between the second bonding layer 4b and the underlying protective material 7.

In FIGS. 7A-7B, two opposing reconstituted wafers 20a, 20b can be provided and can be directly bonded to form a pair of bonded reconstituted wafers 1'. The reference numerals have been appended with "a" or "b" to denote their respective associations with the reconstituted wafers 20a or 20b. FIG. 7A illustrates the two opposing reconstituted wafers 20a, 20b prior to direct bonding. FIG. 7B illustrates the two opposing reconstituted wafers 20a, 20b after being directly bonded to one another. Use of direct bonding on the carriers 3a, 3b provides the planarity desired at the die bonding surfaces for die-to-die direct bonding of conductive and non-conductive surfaces. In other embodiments, however, the carriers may not be used and instead the reconstituted wafers may comprise elements (e.g., dies) at least partially embedded in a molding compound or encapsulant without the use of a carrier. In FIG. 7B, the nonconductive protective layers can be directly bonded to one another without an adhesive along the bond interface 12. Other non-conductive field regions of the reconstituted wafers 20a, 20b (such as nonconductive field regions 5a, 5b of bonding layers 4a, 4b, the nonconductive layer(s) 8, etc.) can also be bonded to one another by an adhesive. Moreover, the conductive contacts 6a, 6b can be directly bonded without an adhesive. In some embodiments, some or all of the conductive contacts 6a, 6b can be initially recessed relative to the bonding surfaces. The bonded wafers 20a, 20b can be heated to cause the contacts 6a, 6b to expand and form an electrical contact. After heating, the interface between the contacts 6a and 6b may not be in the same plane as the bond interface 12.

Additional reconstituted wafers 20a, 20b can be provided as shown in FIGS. 8A-8B to provide any number of stacked reconstituted wafers 1'. The stacked reconstituted wafers 1' can be singulated along singulation streets S to provide a plurality of bonded structures 1. Any suitable number of reconstituted wafers 20a, 20b can be provided to form the stacked reconstituted wafers 1', which can also be singulated to form any suitable number of bonded structures 1. The singulation can be before removal of the carriers 3 as shown (if sacrificial), or after singulation. In some embodiments, as shown in FIG. 8A, both carriers 3a, 3b may not be removed prior to singulation. In some embodiments, as shown in FIG. 8B, one carrier 3a can be removed prior to singulation. In other embodiments, both carriers 3a, 3b can be removed prior to singulation. As explained herein, removal of the carriers 3a and/or 3b using, for example, an etch process, may leave behind a nano oxide layer 11 to facilitate additional direct bonding.

Figure 9E:
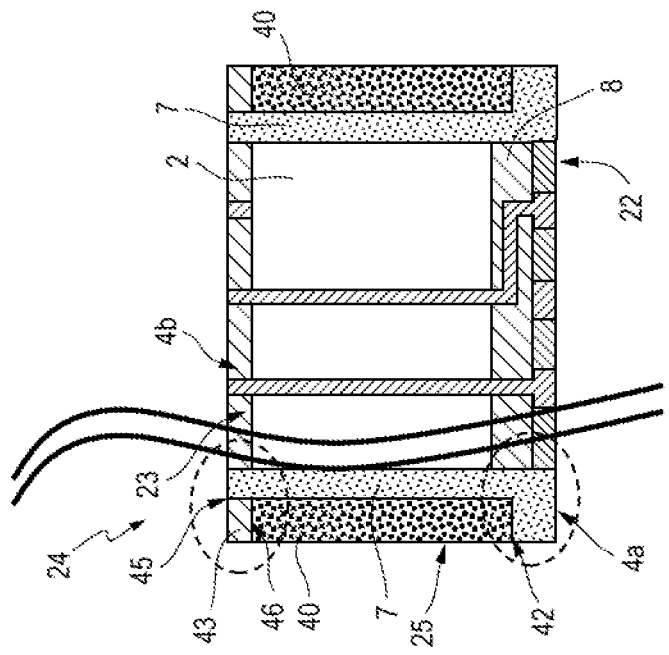
Figure 9F:
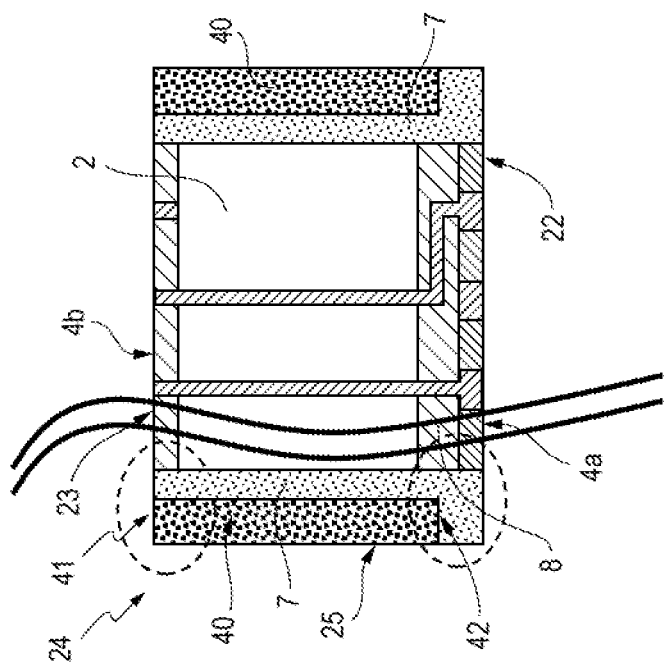

FIGS. 9A-9F and 10A-10E illustrate various face up or face down bonded structures 1 that can result from the methods described herein. The bonded structures 1 shown in FIGS. 9A-9F and 10A-10E can comprise singulated reconstituted elements 24, such as singulated reconstituted integrated device dies. The singulated reconstituted elements 24 are shown in FIGS. 9A, 9E and 9F for illustrative purposes to show what structures may result from a singulated reconstituted wafer 20, according to various embodiments. As shown in FIGS. 9A-9F and 10A-10E, the surfaces nearest to active circuitry or devices can be the front surfaces 22 of the bonded structures 1, while the surfaces opposite the front surfaces 22 can be the back surfaces 23. Unlike individually picked and placed dies or elements, the directly bonded reconstituted elements 24 of the illustrated embodiments can have coplanar side surfaces as well as a direct bonding interface 12 between conductive (e.g., metal) and nonconductive (e.g., inorganic dielectrics such as oxides, including nitrogen and/or fluorine content to aid direct bonding) surfaces of the reconstituted elements 24, with no intervening adhesives.

FIGS. 9A-9F illustrate examples of face down bonded structures. Turning to FIG. 9A, the singulated reconstituted element 24 can comprise the element 2, the nonconductive layer 18 disposed on the thinned back side 10' of the element 2, and bonding layers 4a, 4b at the front and back surfaces 22, 23, respectively. As shown in FIG. 9A, the protective material 7 can extend from the back side 23 to the front side 22 of the reconstituted element 24. Thus, in the embodiment of FIG. 9A, the singulated reconstituted element 24 can have a sidewall 25 defined by the outer exposed surface of the protective material. A vertical interface 26 can be defined between the protective material 7 and the element 2, the nonconductive layer 8, and the first and second bonding layers 4a, 4b. In the arrangement of FIG. 9A, the protective material 7 accordingly abuts the bonding layers 4a, 4b, which may be applied before the protective material 7 is provided. In other embodiments, as explained in connection with FIG. 6, one or more of the bonding layers 4a, 4b can extend over the protective material 7 such that the sidewall 25 includes the protective material 7 and a side edge of the bonding layers 4a and/or 4b.

FIG. 9B illustrates a front-to-back bonding arrangement in which the front surface 22a of the reconstituted element 24a is directly bonded to the back surface 23b of the reconstituted element 24b without an intervening adhesive to form the bonded structure 1. In FIG. 9B, a first portion 7a of protective material can extend from the back surface 23a of the reconstituted element 24a to the bonding interface 12. A second portion 7b of protective material can extend from the bonding interface 12 to the front surface 22b of the reconstituted element 24b.

FIG. 9C illustrates a front-to-front bonding arrangement in which the front surface 22a of the reconstituted element 24a is directly bonded to the front surface 23a of the reconstituted element 24b without an intervening adhesive to form the bonded structure 1. In FIG. 9C, the first portion 7a of protective material can extend from the back surface 23a of the reconstituted element 24a to the bonding interface 12. The second portion 7b of protective material can extend from the bonding interface 12 to the back surface 23b of the reconstituted element 24b.

FIG. 9D illustrates a back-to-back bonding arrangement in which the back surface 23a of the reconstituted element 24a is directly bonded to the back surface 23b of the reconstituted element 24b without an intervening adhesive to form the bonded structure 1. In FIG. 9D, the first portion 7a of protective material can extend from the front surface 22a of the reconstituted element 24a to the bonding interface 12. The second portion 7b of protective material can extend from the bonding interface 12 to the front surface 22b of the reconstituted element 24b.

FIGS. 9E and 9F illustrate additional examples of singulated reconstituted elements 24 that utilize a second protective layer 40. Additional details regarding methods of forming the reconstituted element 24 of FIGS. 9E and 9F may be found below in, for example, FIGS. 11-12C. In the embodiment of FIG. 9E, for example, the second protective material can be applied over the protective material 7. In FIG. 9E, the second protective material may be exposed at the back surface 23 of the reconstituted element 24 adjacent the bonding layer 4b. Further, the protective material 7 can be exposed at the front surface 22 adjacent the bonding layer 4a and underlying the second protective layer 40. Thus, in FIG. 9E, the sidewall 25 can include a horizontal interface 42 between the first and second protective materials 7, 25. Moreover, at the back surface 23, a vertical interface 41 can be provided between the first and second protective materials 7, 25.

In the embodiment of FIG. 9F the second protective material 40 can also be applied over the protective material 7. However, unlike the embodiment of FIG. 9E, in FIG. 9F, a third protective layer 43 can be provided over the second protective material 40. The third protective layer 43 may be exposed at the back surface 23 of the reconstituted element 24. Thus, in FIG. 9F, a vertical interface 45 can be provided between the protective material 7 and the third protective material 43. A horizontal interface 46 can be provided between the second protective material 40 and the third protective material 43.

FIGS. 10A-10E illustrate examples of face up bonded structures 1. Unless otherwise noted, reference numerals in FIGS. 10A-10E may refer to the same or generally similar components as reference numerals in FIGS. 9A-9F. Turning to FIG. 10A, a singulated reconstituted element 24 is shown in a face up orientation. In FIGS. 10B-10D, respective reconstituted elements 24a, 24b are directly bonded to one another to form bonded structures.

As with FIG. 9B, FIG. 10B illustrates a front-to-back bonding arrangement in which the front surface 22a of the reconstituted element 24a is directly bonded to the back surface 23b of the reconstituted element 24b without an intervening adhesive to form the bonded structure 1. In FIG. 10B, a first portion 7a of protective material can extend from the back surface 23a of the reconstituted element 24a to the bonding interface 12. A second portion 7b of protective material can extend from the bonding interface 12 to the front surface 22b of the reconstituted element 24b.

FIG. 10C illustrates a back-to-back bonding arrangement in which the back surface 23a of the reconstituted element 24a is directly bonded to the back surface 23b of the reconstituted element 24b without an intervening adhesive to form the bonded structure 1. In FIG. 10C, the first portion 7a of protective material can extend from the front surface 22a of the reconstituted element 24a to the bonding interface 12. The second portion 7b of protective material can extend from the bonding interface 12 to the front surface 22b of the reconstituted element 24b.

FIG. 10D illustrates a front-to-front bonding arrangement in which the front surface 22a of the reconstituted element 24a is directly bonded to the front surface 22b of the reconstituted element 24b without an intervening adhesive to form the bonded structure 1. In FIG. 10D, the first portion 7a of protective material can extend from the back surface 23a of the reconstituted element 24a to the bonding interface 12. The second portion 7b of protective material can extend from the bonding interface 12 to the back surface 23b of the reconstituted element 24b. In FIG. 10D, the bonding layers 4a can extend over the protective material 7a, 7b and can be exposed on the sidewall 25. As explained above in connection with FIG. 6, in some embodiments, the bonding layer 4a can be provided across the wafer over the protective material 7 such that, when the reconstituted wafer is singulated, the bonding layer 4a is exposed at the sidewall and flush with the protective material 7 at the sidewall 25.

FIG. 10E illustrates a singulated reconstituted element 24 that has a second protective material 40 disposed over side and upper surfaces of the protective material 7. Unlike the embodiment of FIGS. 9E and 9F, in FIG. 10E, the first front bonding layer 4a can be coplanar or flush with the second protective material 40. The second back bonding layer 4b can be coplanar or flush with the protective material 7.

Figure 11:
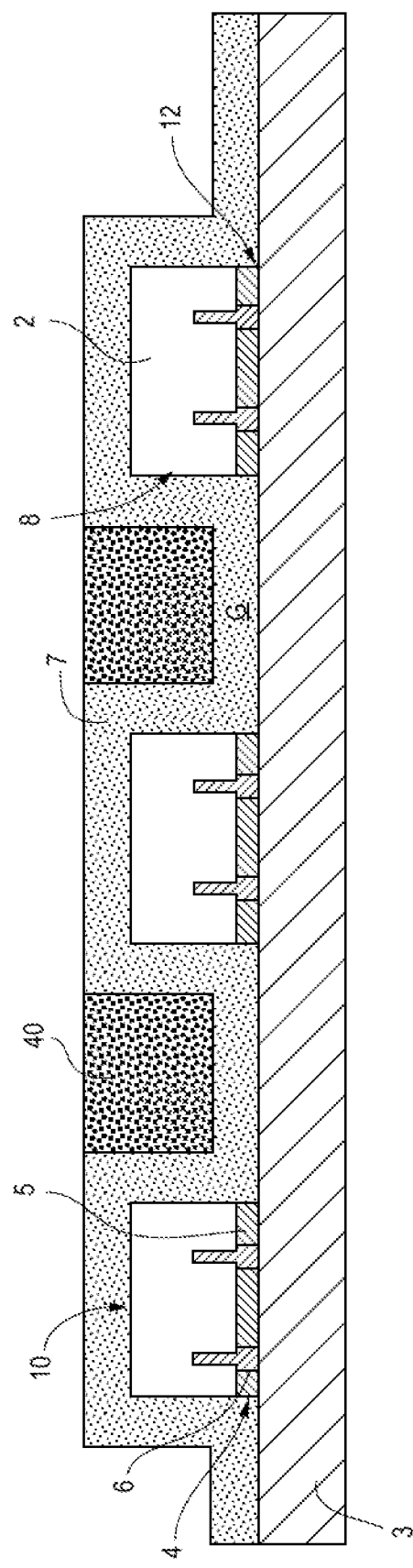
FIG. 11 illustrates another embodiment in which an additional filler material can serve as a second protective material and may be provided over a conformal protective material in the gaps between adjacent elements.

FIG. 11 illustrates another embodiment similar to those described above, except an additional filler material can serve as a second protective material 40 and may be provided over a conformal protective material 7 in the gaps G between adjacent elements 2. The protective material 7 can be deposited conformally over the back sides 10 and side surface 8 of the elements 2 and over the upper surface of the carrier 3. The conformal protective material 7 can have gaps G between portions of the protective material 7 disposed on the side surfaces 8 of the elements 2. The second protective material 40 can serve to fill the gaps G. The second filler protective material 40 can comprise any suitable material, including organic or inorganic materials.

Figure 12A:
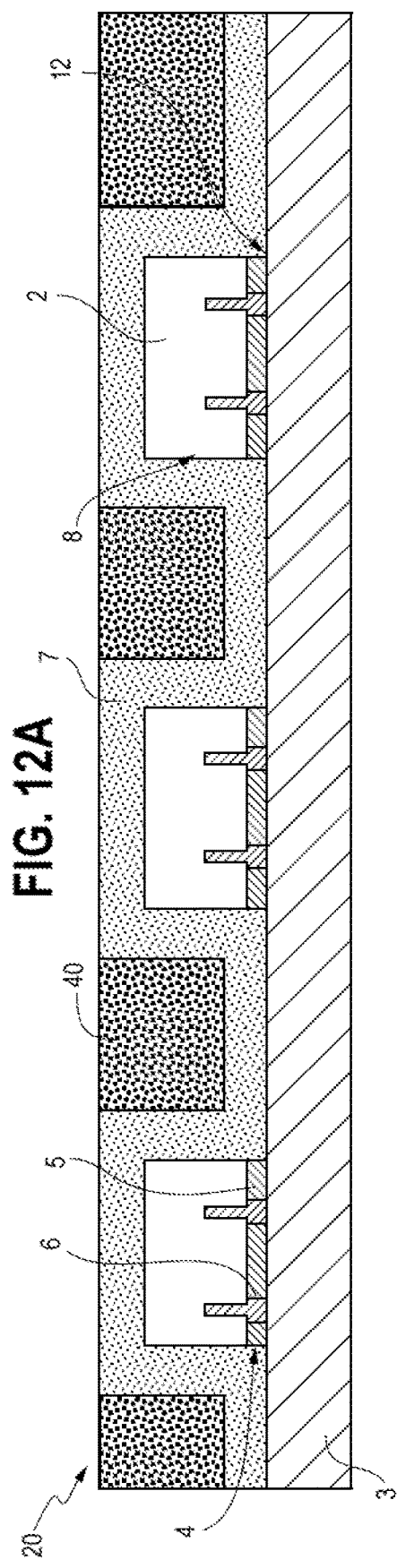
FIGS. 12A-12C illustrate a method for forming a reconstituted wafer according to various embodiments.
Figure 12B:
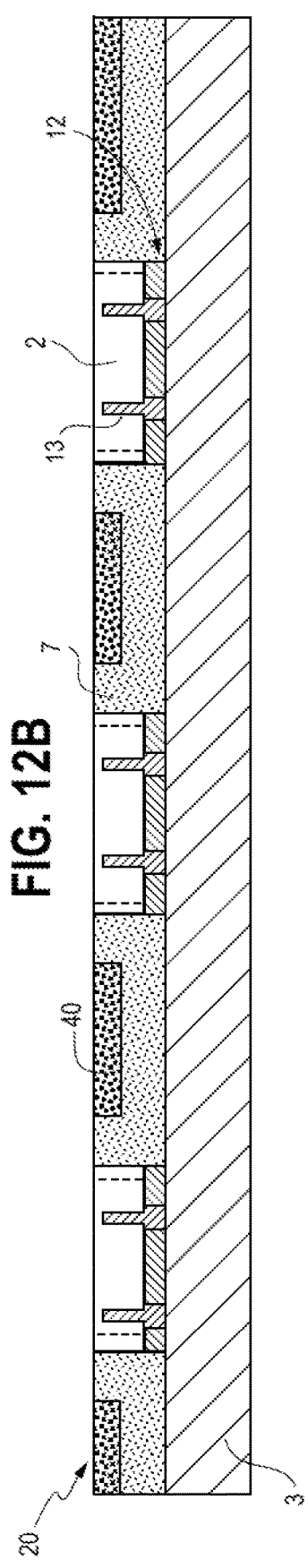
Figure 12C:
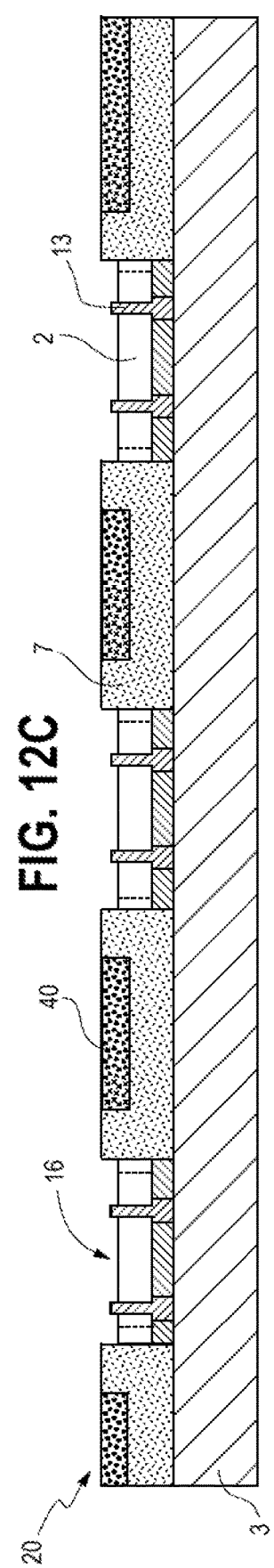

FIGS. 12A-12C illustrate a method for forming a reconstituted wafer 20 according to various embodiments. FIG. 12A is generally similar to FIG. 11, except additional portions of the second protective material 40 are provided on the ends of the outer elements 2. In FIG. 12B, a portion of the protective material 7 and a portion of the second filler protective material 40 can be removed to provide a generally planar surface. In various embodiments, for example, the respective portions of the filler and conformal protective materials 40, 7 can be removed by etching, lapping, grinding, chemical mechanical polishing (CMP), etc. In FIG. 12C, a portion of the bulk semiconductor material of the elements 2 or dies (e.g., silicon) can be removed to form a cavity 16, for example, by etching, lapping, CMP, etc., to expose the conductive vias 13. The conformal and/or gap-fill protective materials may have coefficient(s) of thermal expansion that is (are) within 5 ppm/° C. of a coefficient of thermal expansion of the elements 2 (e.g., integrated device dies).

Figure 13A:
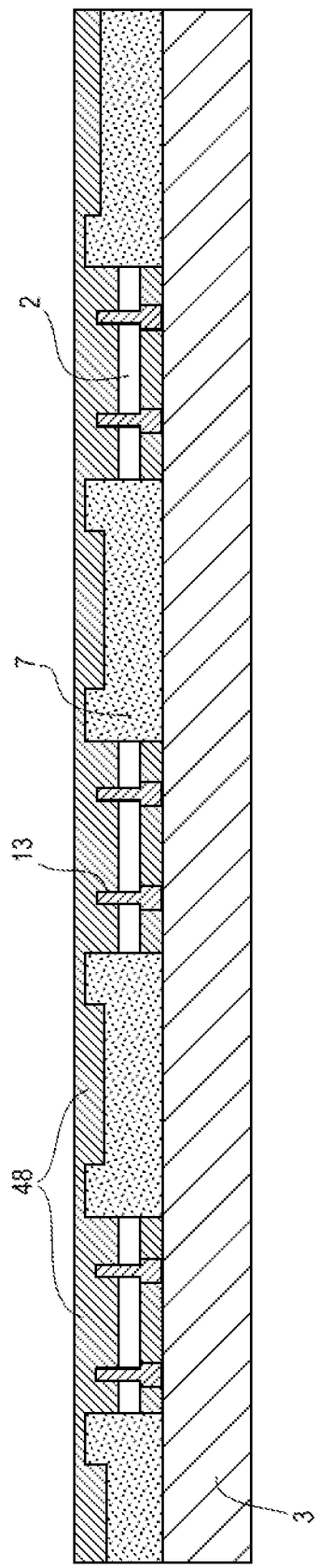
FIGS. 13A-13B illustrate a method for forming a reconstituted wafer according to various embodiments.
Figure 13B:
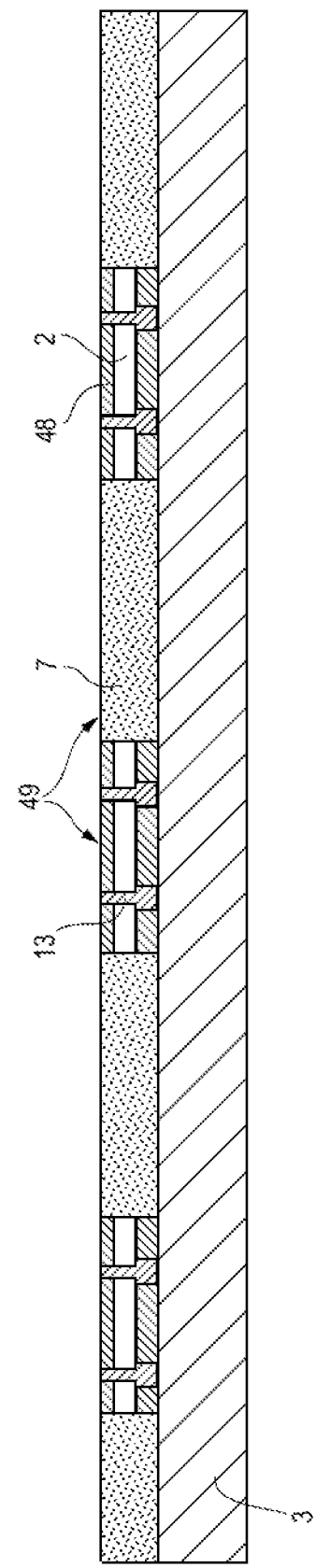

In FIG. 13A, the second filler protective material 40 can be removed from the structure shown in FIG. 12C, and an additional protective material 48 can be provided over the elements 2 and the exposed vias 13. In FIG. 13B, the provided additional protective material 48 and a portion of the protective material 7 can be removed or planarized to form a bonding surface 49 with the vias exposed on the upper surface.

FIGS. 14A-14C illustrate another embodiment in which a mold compound can be provided between adjacent elements 2 directly bonded to a carrier 3 without an adhesive. In FIG. 14A, the vias 13 are shown as being exposed on the back side, but in other embodiments, the vias 13 can be buried as illustrated above. As shown in FIG. 14B, a metal 51 (such as copper) can be provided over the mold compound 51 as shown in FIG. 14B. For example, in various embodiments, the metal 51 can be provided using an electroless plating process, a sputtering process, or any other suitable method. As shown in FIG. 14C, the metal 51 can be planarized, for example, by chemical mechanical polishing (CMP), or any other suitable method. In some embodiments, structures that utilize an organic material for the mold compound may be challenging to planarize using CMP to sufficient smoothness (e.g., less than 5 nm, etc.). By providing a metal 51 (such as copper) over the mold compound, CMP or other planarization processes can be used to planarize to sufficient smoothness for direct bonding.

Figure 16A:
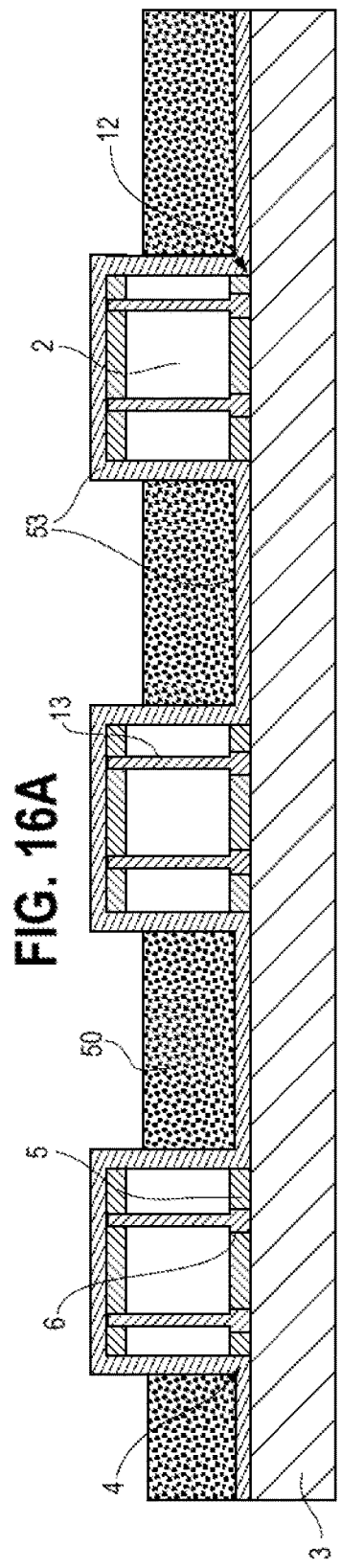
FIGS. 16A-16C illustrate another embodiment in which a protective coating or layer can be provided between the mold compound and the carrier.
Figure 16B:
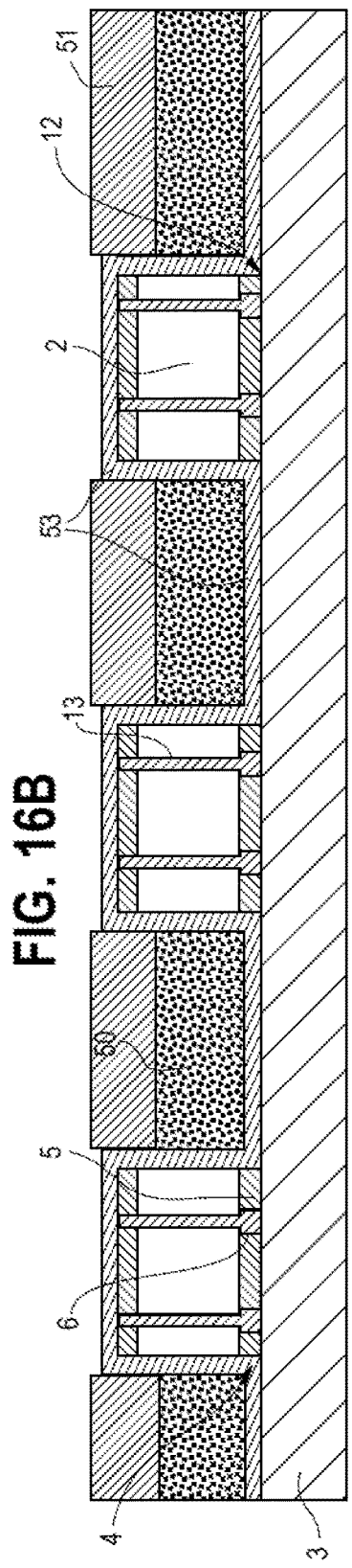
Figure 16C:
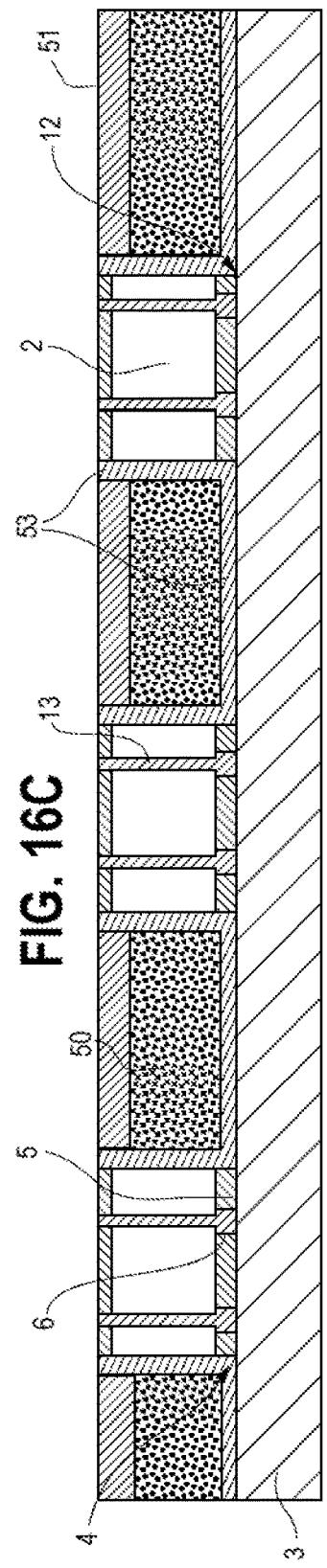

FIGS. 15A-15C are generally similar to FIGS. 14A-14C, except in FIGS. 15A-15C, a second metal 52 can be provided over the carrier 3 between the carrier 3 and the mold compound 50. FIGS. 16A-16C illustrate another embodiment in which a protective coating 53 or layer (e.g., silicon oxide) can be provided between the mold compound and the carrier 3. A protective coating can also be provided after die placement and before metal deposition in various embodiments. In FIG. 16A, the protective coating 53 can conformally coat the upper surface of the carrier 3 and upper and side surfaces of the elements 3. The mold compound 50 can be provided over the protective coating 53 and between the elements 2. In FIG. 16B, the metal 51 can be provided over the mold compound 50 as explained above. In FIG. 16C, the portions of the protective coating 53 that overlie the elements 2 can be removed using a polishing, grinding, or lapping process to expose the vias 13. The metal 51 and element 2 can be planarized to form a smooth surface for bonding.

FIGS. 17A-17D illustrates additional bonded structures 1 that can be provided with the methods disclosed herein. In FIG. 17A, the bonded structure 1 can include a plurality of elements 2, which can include combinations of integrated device dies and interposers. Thus, the methods disclosed herein can be used for active and/or inactive devices. Moreover, as shown in FIG. 17A, an insulating column 55 can be provided to separate the adjacent elements 2 in the upper reconstituted element. In FIG. 17B, the bonded structure 1 can include one or more redistribution layers (RDLs) 57 which can include lateral conductive routing traces to carry signals laterally inward or outward. The RDLs 57 can enable fan-in or fan-out arrangements for connecting to an external package substrate. In FIG. 17C, a conductive via 56 can be provided in the insulating column 56 to carry signals from the lower element 2 to the upper surface of the bonded structure 1. In FIG. 17D, the bonded structure 1 can include both the via 56 in the insulating column 56 and the RDL(s) 57. Skilled artisans will understand that additional combinations may be suitable.

Additional Examples of Integrated Device Packages

Integrated device packages can include one or multiple integrated device dies (e.g., chips) that have active circuitry, such as transistors and other types of active devices. The integrated device dies can be mounted to a carrier, such as a semiconductor interposer, a semiconductor or dielectric (e.g., glass) substrate, another integrated device die, a reconstituted wafer or element, etc. In various arrangements, a molding compound or encapsulant can be provided over the integrated device dies and exposed surfaces of the package substrate. The molding compound can comprise a polymer material, such as an epoxy or potting compound. The material of the molding compound can have a coefficient of thermal expansion (CTE) that differs from the CTE of the carrier and/or of the integrated device die(s). During process steps at elevated temperatures, the CTE mismatch between the molding compound and the carrier (and/or integrated device die(s)) may induce stresses in the carrier and/or integrated device die(s). For example, the stresses induced by CTE mismatch can cause cracking and/or warpage of the carrier and/or integrated device die(s), which can reduce package yield and/or affect system performance. Accordingly, there remains a continuing need for improved packages that reduce stresses due to CTE mismatch between molding compound and the carrier (and/or integrated device die(s)).

FIG. 18A is a schematic side sectional view of an integrated device package 82, according to various embodiments. FIG. 18B is a schematic top plan view of the integrated device package 82 of FIG. 18A. As shown in FIGS. 18A-18B, the package 82 can comprise a carrier 103 and a plurality of integrated device dies 102 mounted to an upper surface of the carrier 103. The integrated device dies 102 can comprise active circuitry. For example, the integrated device dies 102 can comprise processor die(s), memory die(s), sensor die(s), microelectromechanical systems (MEMS) dies, or any other suitable device that includes active circuitry (such as transistors or other active devices). Three integrated device dies 102 are shown in the top view of FIG. 18B, but it should be appreciated that any suitable number of device dies 102 can be provided. For example, one or two integrated device dies 102 can be mounted to the carrier 103, or more than three integrated device dies 102 can be mounted to the carrier. Further, in FIGS. 18A-18B, the integrated device dies 102 are spaced apart laterally along the carrier 103. Alternatively or additionally, integrated device dies 102 can be stacked vertically in order to reduce package footprint.

The carrier 103 can comprise any suitable support structure for the integrated device dies 102. For example, in some embodiments, the carrier 103 can comprise an interposer (such as a semiconductor interposer), a semiconductor or dielectric (e.g., glass) substrate, another integrated device die (e.g., an active chip with active electronic circuitry), a reconstituted wafer or element, etc. The carrier 103 can comprise a material (e.g., a semiconductor material, a dielectric material, etc.) having a first CTE. In various embodiments, the integrated device dies 102 can have a CTE that is substantially similar to the first CTE of the carrier 103. In some embodiments, bulk material of one or more of the dies 102 may be the same material as corresponding bulk material of the carrier 103. In various embodiments, the carrier 103 can comprise silicon, glass, or any other suitable material. In some embodiments, the carrier 103 can comprise an integrated device die (such as a processor die) that has a larger lateral footprint than the dies 102. The integrated device dies 102 can be mounted to the carrier 103 in any suitable manner. For example, the dies 102 can be directly hybrid bonded to the carrier 103 without an adhesive, as explained herein. In such embodiments, nonconductive field regions of the dies 102 can be directly bonded to corresponding nonconductive field regions of the carrier 103 without an adhesive. Moreover, conductive contacts of the dies 102 can be directly bonded to corresponding conductive contacts of the carrier 103 without an adhesive. In other embodiments, however, the dies 102 can be mounted to the carrier 103 with an adhesive. In some embodiments, the carrier 103 can remain coupled to the dies 102 such that the carrier 103 remains present in the larger electronic system. In still other embodiments, the carrier 103 can comprise a temporary structure (such as a mounting tape or sacrificial substrate) that is removed (e.g., lifted off or etched away) and not present in the final electronic package or system.

As shown in FIG. 18A, a molding compound 108 can be provided over the integrated device dies 102 and over an exposed upper surface of the carrier 103. The molding compound 108 is hidden in the top view of FIG. 18B for ease of illustration. The integrated device dies 102 can be at least partially embedded (e.g., completely embedded or buried) within the molding compound 108. As explained above, the molding compound 108 can comprise a polymer material (such as an epoxy or potting compound) that has a second CTE that is different from the first CTE of the carrier 103 (and/or of the dies 102). For example, the second CTE of the molding compound 108 can differ from the first CTE of the carrier 103 (and/or of the dies 102) by an amount that is sufficiently large so as cause CTE-induced stresses on the carrier 103 and/or dies 102 (e.g., the CTE mismatch can be up to about 12 ppm in some cases). As explained above, during process steps at elevated temperatures, the CTE mismatch between the molding compound 108 and the carrier 103 (and/or dies 102) can induce stresses that cause warpage, cracks, or other types of damage to the components of the package 82.

To reduce the effects of CTE mismatch between the molding compound 108 and the carrier 103 (and/or dies 102), the package 82 can include one or a plurality of stress compensation elements 104a-104d mounted to the upper surface of the carrier 103. As shown, the stress compensation elements 104a-104d can be disposed around the integrated device dies 102, such that the integrated device dies 102 are disposed within an interior region of the package 82 surrounded by the stress compensation elements 104a-104d. The molding compound 108 can also be provided or applied over the stress compensation elements 104a-104d, such that the stress compensation elements 104a-104d are at least partially embedded in the molding compound 108. The stress compensation elements 104a-104d can be spaced apart from one another and from the dies 102 by intervening portions of the molding compound 108. The stress compensation elements 104a-104d can comprise a semiconductor material (e.g., silicon), an insulating material (e.g., glass), or any other suitable material type that has a CTE that substantially matches (or is close to) the second CTE of the carrier 103 and/or the dies 102. In some embodiments, the stress compensation elements 104a-104d can comprise the same material as the carrier 103 and/or the dies 102. In other embodiments, the stress compensation elements 104a-104d can comprise a material that is different from that of the carrier 103 and/or the dies 102. Each stress compensation element 104a-104d can comprise the same material, or some (or all) can comprise different materials. In various embodiments, the CTE of the stress compensation elements 104a-104d can be within 10% of the second CTE of the carrier 103 and/or of the integrated device dies 102, within 5% of the second CTE, or within 1% of the second CTE. In various embodiments, the CTE of the stress compensation elements 104a-104d can be less than 10 ppm, less than 8 ppm, or less than 7 ppm. For example, the CTE of the stress compensation elements 104a-104d can be in a range of 3 ppm to 7 ppm.

Beneficially, the stress compensation elements 104a-104d can reduce the stresses imparted to the carrier 103 and/or the dies 102, since the material composition of the stress compensation elements 104a-104d is selected to have a CTE that substantially matches that of the carrier 103 and/or the dies 102. The CTE-matched stress compensation elements 104a-104d can be provided over a large area of the carrier 103 so as to serve as a stress-matched filler that compensates or reduces any stresses induced by the CTE mismatch between the molding compound 108 and the carrier 103 and/or dies 102. For example, in some embodiments, the stress compensation elements 104a-104d can be mounted so as to cover most of an unoccupied area of the carrier 103 (e.g., regions of the carrier 103 that do not support the dies 102 or other electronic components or devices), e.g., at least 20%, at least 50%, at least 75%, at least 85%, or at least 90% of the unoccupied area of the carrier 103. In some embodiments, the stress compensation elements 104a-104d can be mounted so as to cover a range of 20% to 90% of the unoccupied area of the carrier 103, a range of 35% to 90% of the unoccupied area of the carrier 103, or a range of 50% to 90% of the unoccupied area of the carrier 103. In some embodiments, as shown in the top view of FIG. 18B, the stress compensation elements 104a-104d can laterally overlap such that all lines perpendicular to opposing side edges 105a, 105b can pass through or intersect at least one stress compensation element 104a-104d. In such arrangements, the stress compensation elements 104a-104d can serve to prevent or arrest cracks from propagating through the carrier 103.

Further, as shown in the top plan view of FIG. 18B, the stress compensation elements 104a-104d can be disposed between the outer side edges 105a-105d of the package 82 and the integrated device dies 102 such that at least one lateral side edge 109 of each integrated device die 102 lies in a corresponding plane that intersects at least one stress compensation element 104a-104d. In some embodiments, a majority (or all) of the side edges 109 of the dies 102 can lie in respective planes that intersect at least one stress compensation element 104a-104d.

FIG. 18C is a schematic top plan view of an integrated device package 82, that includes increased lateral overlap among the stress compensation elements 104a-104d. Unless otherwise noted, the components of FIG. 18C may be the same as or generally similar to like-numbered components of FIGS. 18A-18B. In FIG. 18C, stress compensation element 104b is vertically (as shown in the top view) shortened, and stress compensation element 104d is horizontally (as shown in the top view) lengthened as compared to FIG. 18B. Thus, in FIG. 18C, stress compensation element 104d can extend to and be exposed along side edge 105b. In FIG. 18C, all lines perpendicular to each side edge 105a-105d can pass through or intersect with at least one stress compensation element 104a-104d, which can prevent or arrest crack propagation.

In some embodiments, the stress compensation elements 104a-104d can comprise dummy stress compensation elements that are devoid of active circuitry, e.g., there are no active devices in the dummy stress compensation elements. In such embodiments, the dummy stress compensation elements can comprise dummy pieces or blocks of a semiconductor material (such as silicon) or a dielectric material (such as glass) without any active circuitry. The use of dummy elements can provide further benefits because no circuitry or devices need be patterned or formed in the elements 104a-104d, which can reduce processing costs and complexity. However, in other embodiments, one or more of the stress compensation elements 104a-104d may comprise an active integrated device die with active circuitry or devices. The use of multiple stress compensation elements 104a-104d can beneficially enable the package assembler to pick and place the elements 104a-104d at desired locations, e.g., at locations with high susceptibility to cracking and/or in targeted spaces over the carrier 103.

As with the integrated device dies 102, the stress compensation elements 104a-104d can be mounted to the carrier 103 in any suitable manner. For example, the stress compensation elements 104a-104d can be directly bonded to the carrier 103 without an adhesive. As explained above, the stress compensation elements 104a-104d can comprise dummy stress compensation elements without active circuitry. In such embodiments, the stress compensation elements 104a-104d can comprise nonconductive field regions that are directly bonded to corresponding nonconductive field regions of the carrier 103 along a bond interface without an adhesive. Further, in some embodiments, the stress compensation elements 104a-104d may be directly bonded such that the bond interface between the elements 104a-104d and the carrier 103 includes only nonconductive-to-nonconductive direct bonds (e.g., the bond interface is devoid of conductor-to-conductor or metal-to-metal direct bonds). For example, in embodiments that utilize dummy stress compensation elements without active circuitry and/or contact pads, the stress compensation elements 104a-104d can be directly bonded to the carrier 103 utilizing only nonconductive-to-nonconductive direct bonds, e.g., a nonconductive or dielectric bonding layer of the elements 104a-104d can be directly bonded to a corresponding nonconductive or dielectric bonding layer of the carrier 103 without an adheisve. In such embodiments, the nonconductive-to-nonconductive direct bonds can comprise one type or multiple different types of nonconductive material(s) along the bond interface. Thus, in various embodiments disclosed herein, one or more elements (such as dies 102) can be hybrid direct bonded to the carrier 103 along a bond interface without an adhesive such that nonconductive field regions and conductive contact pads of the one or more elements (e.g., dies 102) are directly bonded to corresponding nonconductive field regions and conductive contacts of the carrier 103. One or more other elements (such as stress compensation elements 104a-104d) can be directly bonded to the carrier 103 without an adhesive along the bond interface such that the bond interface between the stress compensation elements 104a-104d and the carrier 103 includes only nonconductive-to-nonconductive direct bonds (e.g., directly bonded dielectric bonding layers of the elements 104a-104d and carrier 103). For example, some elements 104a-104d may not include any conductive contacts that are directly bonded to the carrier 103. The nonconductive field regions of the dies 102, stress compensation elements 104a-104d, and/or carrier 103 can comprise an inorganic dielectric material (e.g., silicon oxide). The nonconductive field regions can comprise unpatterned portions of the dies 102, stress compensation elements 104a-104d, and/or carrier 103. The bond interface can include signature indicative of direct nonconductive bonds, such as nitrogen terminated surfaces, fluorine peak(s) at the bond interface and at upper and/or lower interfaces of dielectric bonding layers of the elements.

In other embodiments, such as those in which the stress compensation elements 104a-104d comprise circuitry and contact pads, both nonconductive field regions and contact pads of the stress compensation elements 104a-104d can be directly bonded to corresponding nonconductive field regions and contact pads of the carrier 103. In still other embodiments, the stress compensation elements 104a-104d can be bonded to the carrier 103 with an adhesive. In some embodiments, the carrier 103 can be mounted to an external device, such as a system motherboard, or to another structure. In other embodiments, the carrier 103 can comprise a temporary support structure that can be removed after the molding compound 108 is applied. Four stress compensation elements 104a-104d are shown in FIG. 18B, but it should be appreciated that fewer than four, or more than four, stress compensation elements 104a-104d can be provided.

As shown in FIGS. 18A-18B, the package 82 can comprise outer side edges 105a-105d. The package 82 can be formed from a singulation process by which a larger wafer or reconstituted wafer is singulated along singulation streets S to yield a plurality of singulated packages 82. In some embodiments, singulation can comprise a sawing process, an etching process, or any other suitable process by which packages 82 can be formed from a larger wafer or reconstituted wafer. After singulation, the outer side edges 105a-105d (including, e.g., outer edges of the stress compensation elements 104a, 104c, the carrier 103, and/or the molding compound 108 as shown in FIG. 18B) can comprise singulation markings indicative of the singulation process. For example, for saw singulation processes, the singulation markings can comprise saw markings, such as striations in the singulated surface. For etch singulation processes, the singulation markings can comprise marks or microstructures indicative of the etch pathway. In the embodiment of FIG. 18C, the outer side edge 105b can include an outer edge of stress compensation element 104d, an edge of the carrier 103 and the molding compound, each of which may include markings indicative of the singulation process. It should be appreciated that the stress compensation elements 104a-104d can be positioned anywhere along the carrier 103. For example, in other embodiments, some or all of the stress compensation elements 104a-104d can be positioned laterally inset relative to the outer side edges 105a-105d of the package 82 such that the stress compensation elements 104a-104d are embedded in the molding compound 108.

In various embodiments, the singulation streets S can pass through one or more of the stress compensation elements 104a-104d such that, upon singulation, the molding compound 108 and one or more stress compensation elements 104a-104d can be exposed along one or more outer side edges 105a-105d of the package 82. For example, as shown in FIGS. 18A-18B, stress compensation elements 104a, 104c can comprise side edges 106a, 106c that are exposed at the corresponding outer side edges 105a, 105c of the package 82. In addition, side edges 107 of the molding compound 108 can be exposed along the outer side edges 105a-105d of the package 82. As shown, the exposed side edges 106a, 106c of the stress compensation elements 104a, 104c can be flush with the side edges 107 of the molding compound 108, including portions of the molding compound 108 that are over the stress compensation elements 104a, 104c and portions of the molding compound 108 that are laterally adjacent the stress compensation elements 104a, 104c. In various embodiments, some stress compensation elements 104b, 104d can be laterally inset relative to the outer side edges 105b, 105d of the package 82, such that the elements 104b, 104d may be completely embedded in the molding compound 108. In some embodiments, all of the stress compensation elements 104a-104d can be laterally inset relative to the outer side edges 105a-105d.

FIG. 19 is a schematic diagram of a system 80 incorporating one or more integrated device packages 82, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more integrated device dies and/or bonded structures 1. The integrated device dies and/or bonded structures can comprise any of the integrated device packages and/or bonded structures shown and described above in connection with FIGS. 1A-18B.

In one embodiment, an integrated device package is disclosed. The integrated device package can comprise a carrier an a molding compound over a portion of an upper surface of the carrier. The integrated device package can comprise an integrated device die mounted to the carrier and at least partially embedded in the molding compound, the integrated device die comprising active circuitry. The integrated device package can comprise a stress compensation element mounted to the carrier and at least partially embedded in the molding compound, the stress compensation element spaced apart from the integrated device die, the stress compensation element comprising a dummy stress compensation element devoid of active circuitry. At least one of the stress compensation element and the integrated device die can be directly bonded to the carrier without an adhesive.

In another embodiment, an integrated device package is disclosed. The integrated device package can include a molding compound and an integrated device die at least partially embedded in the molding compound, the integrated device die comprising active circuitry. The integrated device package can include a plurality of dummy stress compensation elements at least partially embedded in the molding compound, the plurality of dummy stress compensation elements devoid of active circuitry, the plurality of dummy stress compensation element spaced apart from one another by the molding compound.

In another embodiment, a method of forming an integrated device package is disclosed. The method can include providing a molding compound over an integrated device die and a plurality of dummy stress compensation elements, the plurality of dummy stress compensation elements spaced apart from one another by the molding compound. The integrated device die can comprise active circuitry. The plurality of dummy stress compensation elements can be devoid of active circuitry.

In another embodiment, an integrated device package is disclosed. The integrated device package can comprise a molding compound and an integrated device die at least partially embedded in the molding compound, the integrated device die comprising active circuitry. The integrated device package can comprise a stress compensation element at least partially embedded in the molding compound and spaced apart from the integrated device die. The molding compound and the stress compensation element can be exposed at an outer side edge of the integrated device package.

In another embodiment, an electronic component is disclosed. The electronic component can comprise a carrier having a first nonconductive field region and a first conductive contact. The electronic component can comprise a first element directly hybrid bonded to the carrier without an adhesive, a second nonconductive field region of the first element directly bonded to the first nonconductive field region of the carrier without an adhesive and a second conductive contact of the first element directly bonded to the first conductive contact of the carrier. The electronic component can comprise a second element directly bonded to the carrier without an adhesive such that only a third nonconductive field region of the second element is directly bonded to the first nonconductive field region of the carrier.

In another embodiment, an electronic component is disclosed. The electronic component can include a carrier having a first nonconductive field region and a first conductive contact. The electronic component can include a first element directly hybrid bonded to the carrier without an adhesive, a second nonconductive field region of the first element directly bonded to the first nonconductive field region of the carrier without an adhesive and a second conductive contact of the first element directly bonded to the first conductive contact of the carrier. The electronic component can include a second element directly bonded to the carrier without an adhesive, wherein the second element does not include any conductive contacts that are directly bonded to the carrier.

In one embodiment, a bonded structure is disclosed. The bonded structure can include a first reconstituted element comprising a first element and having a first side comprising a first bonding surface and a second side opposite the first side. The first reconstituted element can comprise a first protective material disposed about a first sidewall surface of the first element. The bonded structure can comprise a second reconstituted element comprising a second element and having a first side comprising a second bonding surface and a second side opposite the first side. The first reconstituted element can comprise a second protective material disposed about a second sidewall surface of the second element. The second bonding surface of the first side of the second reconstituted element can be directly bonded to the first bonding surface of the first side of the first reconstituted element without an intervening adhesive along a bonding interface. The first protective material can be flush with the first bonding surface and the second protective material can be flush with the second bonding surface.

In another embodiment, a bonded structure is disclosed. The bonded structure can include a first reconstituted element comprising a first element and having a first side and a second side opposite the first side. The bonded structure can include a second reconstituted element comprising a second element and having a first side and a second side opposite the first side, the first side of the second reconstituted element directly bonded to the first side of the first reconstituted element without an intervening adhesive along a bonding interface. The bonded structure can include a protective material disposed about respective first and second side surfaces of the first and second elements. The bonded structure can include a nonconductive layer disposed between the first and second elements, the nonconductive layer flush with at least one of the first and second side surfaces of the first and second elements such that an interface is provided between the protective material and the nonconductive layer.

In another embodiment, a bonded structure is disclosed. The bonded structure can include a first reconstituted wafer comprising a plurality of first elements. The bonded structure can comprise a second reconstituted wafer comprising a plurality of second elements. The first and second reconstituted wafers can be directly bonded to one another without an adhesive.

In another embodiment, a bonding method is disclosed. The bonding method can include applying a first protective material over a plurality of first elements to form a first reconstituted wafer. The bonding method can include applying a second protective material over a plurality of second elements to form a second reconstituted wafer. The bonding method can include directly bonding the first reconstituted wafer to the second reconstituted wafer without an adhesive.

In another embodiment, a bonding method is disclosed. The bonding method can include directly bonding a first element to a carrier without an adhesive. The carrier can comprise a silicon carrier with a silicon oxide layer disposed directly onto a surface of the silicon carrier. The silicon oxide layer can be directly bonded to the first element. The silicon oxide layer can comprise a native oxide layer or a thermal oxide layer.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. An electronic component integrated device package, comprising:
   a substrate having a surface that includes a first nonconductive field region;
   an integrated device die directly bonded to the surface of the substrate without an intervening adhesive, the integrated device die having a second nonconductive field region that directly contacts and is directly bonded to the first nonconductive field region without an intervening adhesive;
   a stress compensation element directly bonded to the surface of the substrate without an intervening adhesive, wherein the stress compensation element is devoid of active circuitry, wherein the stress compensation element comprises a block of a semiconductor material, wherein the stress compensation element is disposed between an outer edge of the electronic component and the integrated device die, and wherein the stress compensation element is laterally inset from the outer edge; and
   an insulating material over the substrate, wherein the integrated device die and the stress compensation element are spaced apart from one another by the insulating material, wherein the stress compensation element is spaced apart from the outer edge by the insulating material, and wherein the insulating material extends between the outer edge and the stress compensation element.

2. The electronic component of claim 1, wherein the substrate comprises a semiconductor substrate.

3. The electronic component of claim 1, wherein the integrated device die comprises a first integrated device die and the substrate comprises a second integrated device die.

4. The electronic component of claim 3, wherein the first integrated device die comprises first active circuitry and the second integrated device die comprises second active circuitry and wherein the first active circuitry is electrically connected to the second active circuitry.

5. The electronic component of claim 4, wherein the first integrated device die is hybrid bonded to a bonding layer on the second integrated device die.

6. The electronic component of claim 1, wherein the stress compensation element comprises a dummy die.

7. The electronic component of claim 1, wherein the semiconductor material comprises silicon.

8. The electronic component of claim 1, wherein the integrated device die comprises a memory die.

9. The electronic component of claim 1, wherein the integrated device die and the stress compensation element are spaced apart from each other by a gap and wherein the insulating material at least partially fills the gap.

10. The electronic component of claim 5, wherein the second integrated device die comprises opposing front and back surfaces, wherein the second active circuitry is closer to the front surface than the back surface, and wherein the front surface of the second integrated device die faces away from the first integrated device die.

11. The electronic component of claim 1, further comprising:
   one or more integrated device dies directly bonded to the surface of the substrate without an intervening adhesive, wherein the one or more integrated device dies includes the integrated device die, and wherein the one or more integrated device dies occupy a first portion of the surface of the substrate without occupying a second portion of the surface; and
   one or more stress compensation elements directly bonded to the surface of the substrate without an intervening adhesive, wherein the one or more stress compensation elements includes the stress compensation element and wherein the one or more stress compensation elements occupy at least 50% of the second portion of the surface.

12. The electronic component of claim 1, wherein the stress compensation element comprises a third nonconductive field region, wherein the first and third nonconductive field regions directly contact each other and are directly bonded together without an intervening adhesive, and wherein at least one of the first and third nonconductive field regions comprises an activated surface terminated with nitrogen.

13. An electronic component, comprising:
   a substrate comprising a bonding surface having a first nonconductive field region, wherein the substrate comprises a first integrated device die, wherein the first integrated device die comprises active circuitry, a via, and opposing front and back surfaces, wherein the active circuitry is closer to the front surface than the back surface, and wherein the via extends through the first integrated device die between the opposing front and back surfaces;
   a second integrated device die directly bonded to the substrate without an intervening adhesive and at least partially embedded in an insulating material, wherein the second integrated device die comprises a contact pad, wherein the front surface of the first integrated device die faces away from the second integrated device die, wherein the via is electrically connected to the contact pad, and wherein the second integrated device die has a second nonconductive field region that directly contacts and is directly bonded to the first nonconductive field region without an intervening adhesive; and
   a plurality of dummy elements directly bonded to the substrate without an intervening adhesive, wherein each of the plurality of dummy elements is at least partially embedded in the insulating material, wherein the plurality of dummy elements are devoid of active circuitry, wherein each of the plurality of dummy elements comprises a block of a semiconductor material, and wherein the second integrated device die is separated from each of the plurality of dummy elements by the insulating material, wherein the plurality of dummy elements comprises a first dummy element, wherein the first dummy element is disposed between an outer edge of the electronic component and the second integrated device die, wherein the first dummy element is laterally inset from the outer edge and spaced apart from the outer edge by the insulating material, and wherein the insulating material extends between the outer edge and the first dummy element.

14. The electronic component of claim 11, wherein the second integrated device die is hybrid bonded to the substrate.

15. The electronic component of claim 11, wherein the second integrated device die comprises a memory die.

16. The electronic component of claim 11, wherein the first integrated device die comprises a processor die.

17. The electronic component of claim 11, wherein each of the plurality of dummy elements comprises silicon.

18. The electronic component of claim 15, wherein each of the plurality of dummy elements comprises unpatterned silicon.

19. The electronic component of claim 11, wherein the substrate comprises a bonding layer, wherein at least a portion of the bonding layer is on the back surface of the first integrated device die, and wherein the second integrated device die is directly bonded to the bonding layer.

20. The electronic component of claim 11, wherein the electronic component further comprises:
one or more integrated device dies directly bonded to a bonding surface of the substrate without an intervening adhesive, wherein the one or more integrated device dies includes the second integrated device die, wherein the one or more integrated device dies occupy a first portion of the bonding surface of the substrate without occupying a second portion of the bonding surface, and wherein the plurality of dummy elements occupy at least 50% of the second portion of the bonding surface.

21. The electronic component of claim 11, wherein the plurality of dummy elements comprises a first dummy element having a third nonconductive field region, wherein the first and third nonconductive field regions directly contact each other and are directly bonded together without an intervening adhesive, and wherein at least one of the first and third nonconductive field regions comprises an activated surface terminated with nitrogen.

22. The electronic component of claim 13, wherein the plurality of dummy elements comprises a first dummy element and a second dummy element, wherein the first dummy element is spaced from a first side of the second integrated device die by the insulating material, and wherein the second dummy element is spaced from a second side of the second integrated device die by the insulating material, the first and second sides disposed on opposite sides of the second integrated device die.

23. The electronic component of claim 12, wherein the first dummy element, the second dummy element, and the second integrated device die each comprise a midpoint and wherein a line drawn between the midpoints of the first and second dummy elements does not intersect the midpoint of the second integrated device die.

24. The electronic component of claim 12, wherein the second integrated device die comprises opposing third and fourth sides, wherein a first distance between the third side of the second integrated device die and a first outer side edge of the electronic component is different from a second distance between the fourth side of the second integrated device die and a second outer side edge of the electronic component, the first outer side edge opposite the second outer side edge.

25. The electronic component of claim 12, wherein the second integrated device die comprises opposing third and fourth sides, wherein a first distance between the third side of the second integrated device die and an outer side edge of the electronic component is different from a second distance between the first dummy element and the outer side edge of the electronic component.

26. The electronic component of claim 15, wherein a third distance between the third side of the second integrated device die and the outer side edge of the electronic component is different from a fourth distance between the second dummy element and the outer side edge of the electronic component.

27. The electronic component of claim 13, wherein positions of all dies bonded to the substrate in a plan view defines a die layout, and wherein the die layout is asymmetric about at least one center axis transverse to an outer side edge of the electronic component in the plan view.

28. An electronic component, comprising:
a substrate having a bonding layer that includes a first nonconductive field region;
an integrated device die directly bonded to the substrate and having a second nonconductive field region, wherein the first and second nonconductive field regions directly contact each other and are directly bonded together without an intervening adhesive;
a stress compensation element directly bonded to the substrate and having a third nonconductive field region, wherein the first and third nonconductive field regions directly contact each other and are directly bonded together without an intervening adhesive, wherein the stress compensation element is devoid of active circuitry, and wherein the stress compensation element comprises a block of silicon, and wherein at least one of the first and third nonconductive field regions comprises an activated surface terminated with nitrogen; and
an insulating material, wherein the integrated device die is separated from the stress compensation element by the insulating material
wherein the stress compensation element is disposed between an outer edge of the electronic component and the integrated device die, wherein the stress compensation element is laterally inset from the outer edge and spaced apart from the outer edge by the insulating material, and wherein the insulating material extends between the outer edge and the stress compensation element.

29. The electronic component of claim 18, wherein the bonding layer comprises a first conductive contact and the integrated device die comprises a second conductive contact and wherein the first and second conductive contacts are directly bonded together.

30. The electronic component of claim 19, wherein the integrated device die is hybrid bonded to the substrate.

31. The electronic component of claim 17, wherein the integrated device die comprises a memory die.

32. The electronic component of claim 18, wherein the substrate comprises a processor die.

33. The electronic component of claim 18, wherein the integrated device die comprises a first integrated device die, wherein the substrate comprises a second integrated device die, wherein the second integrated device die comprises active circuitry and opposing front and back surfaces, wherein the active circuitry is closer to the front surface than the back surface, and wherein the front surface of the second integrated device die faces away from the first integrated device die.

34. The electronic component of claim 18, wherein the bonding layer defines a bonding surface of the substrate and wherein the electronic component further comprises:
one or more integrated device dies directly bonded to the bonding surface without an intervening adhesive, wherein the one or more integrated device dies includes the integrated device die and wherein the one or more integrated device dies occupy a first portion of the bonding surface without occupying a second portion of the bonding surface; and
one or more stress compensation elements directly bonded to the bonding surface without an intervening adhesive, wherein the one or more stress compensation elements includes the stress compensation element and wherein the one or more stress compensation elements occupy at least 50% of the second portion of the bonding surface.

\* \* \* \* \*

UNITED STATES PATENT AND TRADEMARK OFFICE
CERTIFICATE OF CORRECTION

PATENT NO. : 12,046,569 B2
APPLICATION NO. : 18/295776
DATED : July 23, 2024
INVENTOR(S) : Belgacem Haba It is certified that error appears in the above-identified patent and that said Letters Patent is hereby corrected as shown below:

In the Claims

In Column 19, Claim 1, Line 23, delete "integrated device package,".

In Column 20, Claim 10, Line 7, delete "claim 5" and insert -- claim 4 --.

In Column 21, Claim 14, Line 12, delete "claim 11" and insert -- claim 13 --.

In Column 21, Claim 15, Line 15, delete "claim 11" and insert -- claim 13 --.

In Column 21, Claim 16, Line 17, delete "claim 11" and insert -- claim 13 --.

In Column 21, Claim 17, Line 19, delete "claim 11" and insert -- claim 13 --.

In Column 21, Claim 18, Line 21, delete "claim 15" and insert -- claim 17 --.

In Column 21, Claim 19, Line 24, delete "claim 11" and insert -- claim 13 --.

In Column 21, Claim 20, Line 29, delete "claim 11" and insert -- claim 13 --.

In Column 21, Claim 23, Line 57, delete "claim 12" and insert -- claim 22 --.

In Column 21, Claim 24, Line 63, delete "claim 12" and insert -- claim 22 --.

In Column 22, Claim 25, Line 5, delete "claim 12" and insert -- claim 22 --.

In Column 22, Claim 26, Line 12, delete "claim 15" and insert -- claim 25 --.

In Column 22, Claim 28, Line 44, after "material" and insert -- , --.

Signed and Sealed this
Twenty-seventh Day of August, 2024

Katherine Kelly Vidal
*Director of the United States Patent and Trademark Office*

CERTIFICATE OF CORRECTION (continued)
U.S. Pat. No. 12,046,569 B2

In Column 22, Claim 29, Line 53, delete "claim 18" and insert -- claim 28 --.

In Column 22, Claim 30, Line 58, delete "claim 19" and insert -- claim 29 --.

In Column 22, Claim 31, Line 60, delete "claim 17" and insert -- claim 28 --.

In Column 22, Claim 32, Line 62, delete "claim 18" and insert -- claim 28 --.

In Column 22, Claim 33, Line 64, delete "claim 18" and insert -- claim 28 --.

In Column 23, Claim 34, Line 6, delete "claim 18" and insert -- claim 28 --.